United States Patent [19]
Kikuchi et al.

[11] Patent Number: 5,315,535
[45] Date of Patent: May 24, 1994

[54] AUTOMATIC ROUTER CAPABLE OF SEARCHING FOR A NEW WIRING WITH REFERENCE TO CONNECTION FAILURES

[75] Inventors: Hideo Kikuchi; Yasushi Utsumi, both of Tokyo, Japan

[73] Assignee: NEC Corporation, Japan

[21] Appl. No.: 83,199

[22] Filed: Jun. 25, 1993

Related U.S. Application Data

[63] Continuation of Ser. No. 618,741, Nov. 27, 1990, abandoned.

[30] Foreign Application Priority Data

Nov. 28, 1989 [JP] Japan ............................... 1-306500

[51] Int. Cl.⁵ .................................................. G06F 15/60
[52] U.S. Cl. .................................... 364/490; 364/489; 364/488
[58] Field of Search ................ 364/491, 490, 489, 488

[56] References Cited

U.S. PATENT DOCUMENTS

| | | | |
|---|---|---|---|
| 4,752,887 | 6/1988 | Kuwahara ............................ | 364/491 |
| 4,768,154 | 8/1988 | Sliwkowski et al. ................ | 364/491 |
| 4,805,113 | 2/1989 | Ishii et al. ........................... | 364/491 |
| 4,835,705 | 5/1989 | Fujino et al. ........................ | 364/491 |
| 4,855,929 | 8/1989 | Nakajima ............................ | 364/488 |

OTHER PUBLICATIONS

"Automated Rip-Up and Rerouter Techniques" by W. A. Dees et al., IEEE 19th Design Automation Conference, 1982, pp. 432–439.

"A Block Interconnection Algorithm for Hierarchical Layout System" by Fukui et al., IEEE Trans. on C.A.D., vol. CAD6., No. 3, May 1987, pp. 383–390.

"Automatic Placement and Routing of Gate Arrays" by G. Robson, VLSI Design, Apr. 1984, pp. 35, 36, 38–40, 42 and 43.

"Outline of Interactive Printed Substrate Design System and Automatic Layout Procedure" by K. Daishidou et al., National Conf. 1985, pp. 1–5.

*Primary Examiner*—Vincent N. Trans
*Attorney, Agent, or Firm*—Laff, Whitesel, Conte, Saret

[57] ABSTRACT

In an automatic router for use in automatically designing wiring paths among connection elements, such as via holes, terminals, on a wiring board, connection failures are previously detected by a connection failure detecting portion. Provisional wiring paths are successively selected by a path searching portion with reference to the connection failures to decide a new wiring path. The new wiring path is inserted among existing wiring paths by moving adjacent ones of the existing wiring paths in a predetermined direction. The connection failures may be specified, for example, by channel failures which appear when any wiring paths can fail to be arranged between the connection elements or by terminal network data signals produced on superposition of coordinate components of adjacent ones of the via holes.

6 Claims, 29 Drawing Sheets

AUTOMATIC ROUTER CAPABLE OF SEARCHING FOR A NEW WIRING WITH REFERENCE TO CONNECTION FAILURES

This application is a continuation of application Ser. No. 07/618,741, filed Nov. 27, 1990 now abandoned.

BACKGROUND OF THE INVENTION

This invention relates to an automatic wiring design device or an automatic router for use in designing wiring paths on a wiring board, such as a print circuit board, an integrated circuit board, or the like.

Heretofore, an automatic router of the type described designs interconnections or wirings between points of connections by the use of either a shove aside technique or a rip-up technique, as described by William A. Dees, Jr. and Patrick G. Karger on pages 432 to 439 in proceedings of 19th Design Automation Conference (1982) and entitled "Automated rip-up and rerouter techniques". More particularly, the shove aside technique is for shoving an existing wiring into adjacent routing resources to secure a room for a new connection while the rip-up technique is for removing a previously defined wiring to reroute a new connection instead of the previously defined wiring.

Herein, use of the shoving aside technique should successively shove each existing wiring aside in a trial-and-error manner until such shoving aside operation becomes successful when the shoving aside operation is unsuccessful in connection with a certain existing wiring. Therefore, the shoving aside technique is very time-consuming.

On the other hand, the rip-up technique should repeatedly remove the previously defined wiring to reroute the new connection in a trial-and-error manner. Therefore, the rip-up technique is also time-consuming so as to improve a degree of connectivity.

In addition, a description about automatic routing is found in VLSI design (April 1984), on pages 35–43. Such an automatic routing is executed on the basis of a channel-routing algorithm, a a line-search algorithm, and a maze router.

Summary of the Invention

It is an object of this invention to provide an automatic router which does not need a long time for improvement of a degree of connectivity and for searching for a new connection.

An automatic router to which this invention is applicable is for use in automatically designing wiring paths among connection elements on a wiring board. According to this invention, the automatic router comprises connection failure detecting means for detecting those connection failures among the connection elements which appear when the connection elements can fail to be connected to each other, provisional path searching means for searching provisional paths among existing ones of the wiring paths with reference to the connection failures detected by the connection failure detecting means, and path decision means for deciding a new wiring path from the provisional paths by moving the existing ones of the wiring paths and the connection elements that are adjacent to the new wiring path.

DESCRIPTION OF THE PREFERRED EMBODIMENTS

First Embodiment

Figure 1:
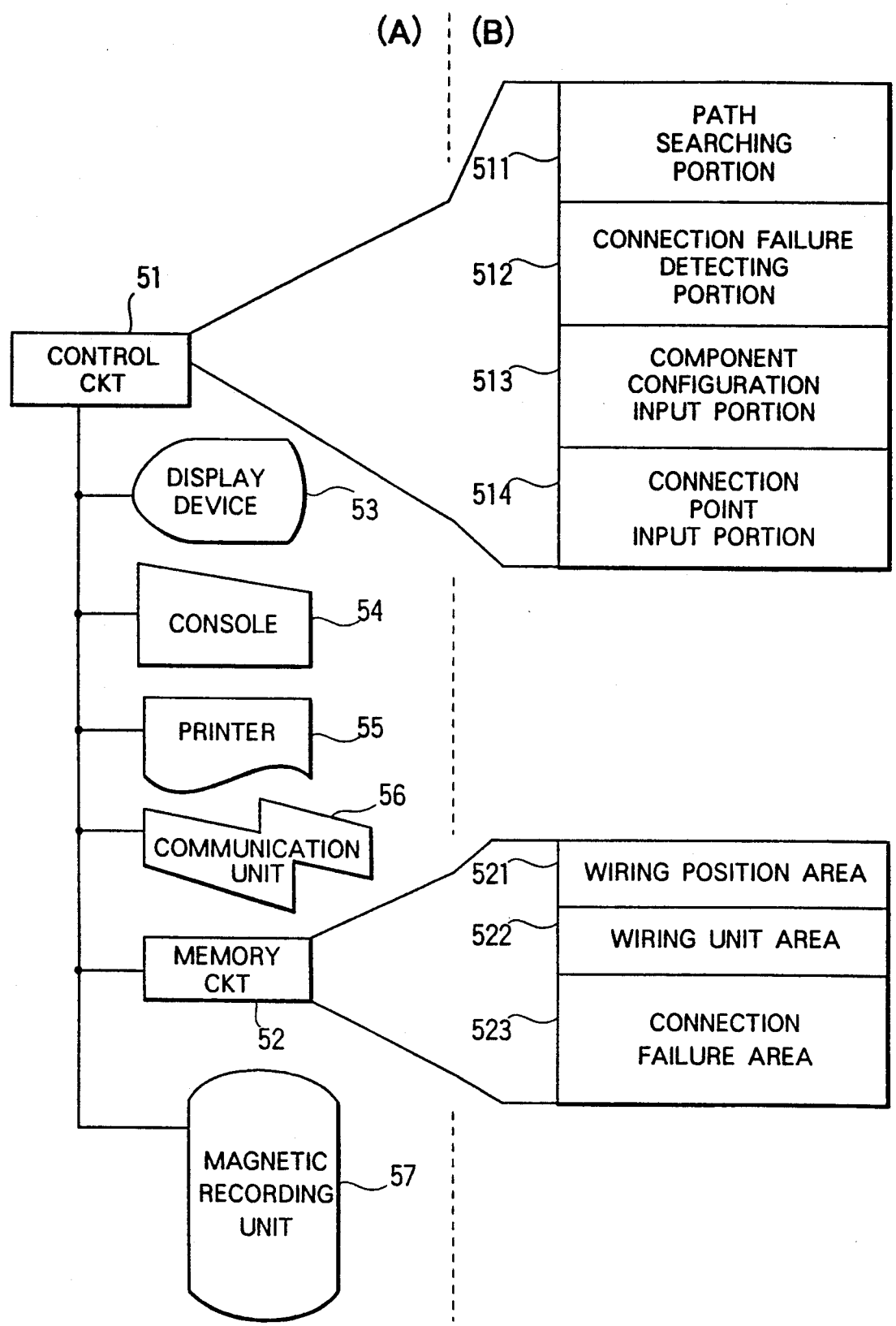
FIG. 1 shows a block diagram of an entire automatic router according to a first embodiment of this invention.

Referring to FIG. 1, an automatic router according to a first embodiment of this invention is divided into first and second parts designated at A and B for brevity of description. It is assumed that the illustrated automatic router is used for a printed circuit board which has conductor patterns, such as via holes, component terminals, connection conductors, and the like, and which may comprise a plurality of layers. The first part A illustrates a whole structure of the automatic router while the second part B specifically illustrates contents of a control circuit 51 and a memory circuit 52 included in the first part A.

The control circuit 51 comprises a control program which includes a path searching portion 511, a path failure detecting portion 512, a part configuration input portion 513, and a connection point input portion 514, as exemplified in the second part B. Each of the portions 511 to 514 will be described later in detail.

On the other hand, the memory circuit 52 comprises a first memory area, namely, wiring position area 521 for memorizing wiring position data signals, as will be mentioned after, a second memory area, namely, wiring unit area 522 for memorizing wiring unit signals representative of wiring units which will be described later, a third memory area, namely, connection failure area 523 for memorizing connection failure signals representative of failures of connection.

In addition to the memory circuit 52, the illustrated automatic router comprises a display device 53, a console 54, a printer 55, a communication unit 56, and a magnetic recording unit 57, all of which are operable under control of the control circuit 51, as will become clear as the description proceeds.

Figure 2:
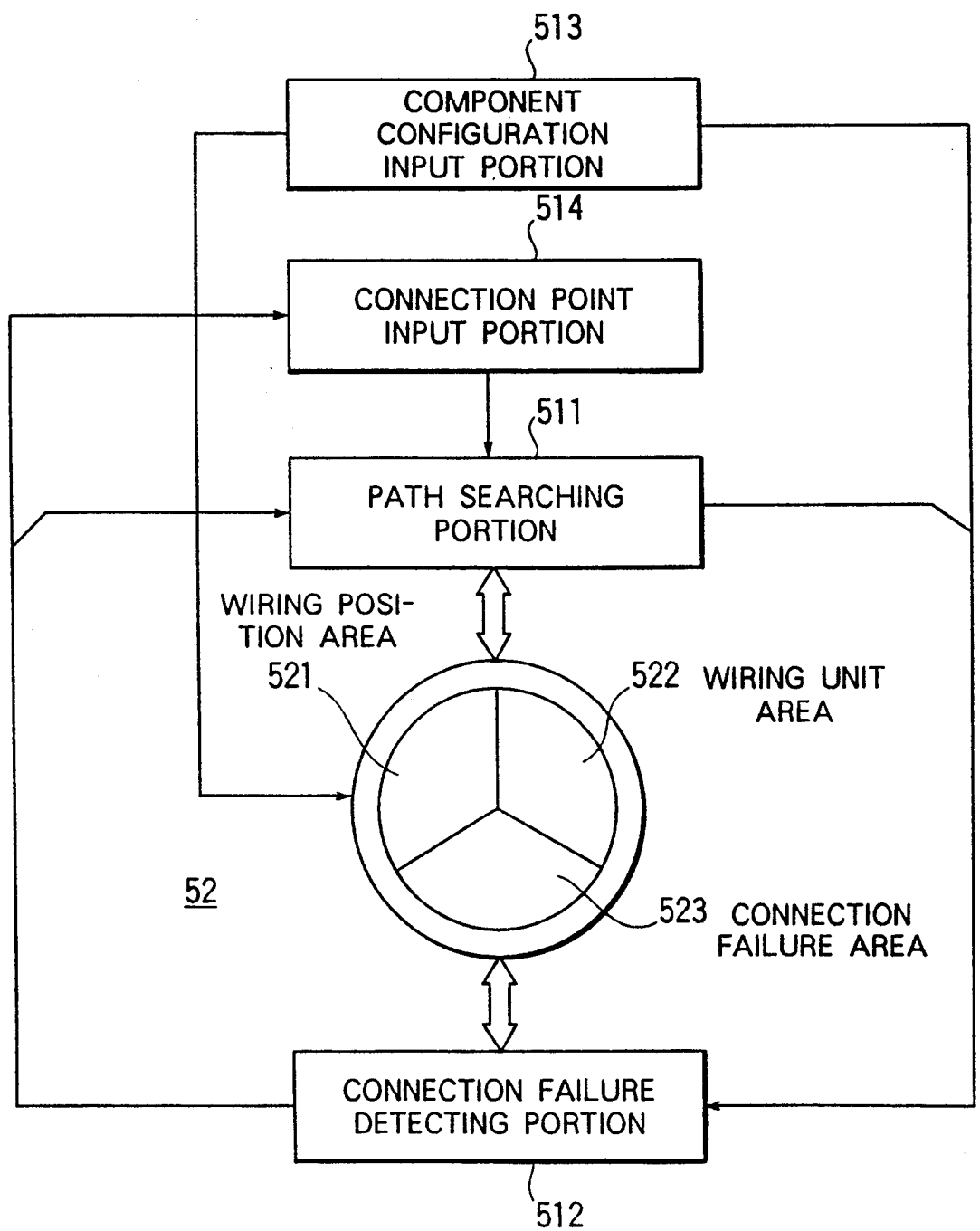
FIG. 2 shows a block diagram for use in describing operation of the automatic router illustrated in FIG. 1.

Referring to FIG. 2, description will be schematically made about an operation of the automatic router illustrated in FIG. 1. In FIG. 2, the control circuit 51 is operated in relation to the memory circuit 52 shown in FIG. 1. More specifically, the component configuration input portion 513, the connection point input portion 514, the path searching portion 511, and the connection failure detecting portion 512 of the control circuit 51 cooperate with the wiring position area 521, the wiring unit area 522, and the connection failure area 523 of the memory circuit 52.

It is to be noted that the component may comprise a component terminal, a via hole, and a connection and that the connection is determined in consideration of a pair of pins or terminals. A configuration of the component and its connection are determined by the component configuration input portion 513 together with a wiring position data signal for the component terminal. The wiring position data signal is memorized or stored in the wiring position area 521 of the memory circuit 52.

On the other hand, the connection point input portion 514 serves to successively indicate a pair of pins to be connected to each other. The connection point input portion 514 puts the path searching portion 511 and the connection failure detecting portion 513 into operation each time when a pair of pins is indicated by the connection point input portion 514.

Briefly, the path searching portion 51 searches for an interconnection path at every pair of the pins to form data signals which are necessary for the wiring and which may be wiring unit data signals and cross line data signals. The wiring unit data signals and the cross line data signals are memorized in the wiring unit area 522 and the connection failure area 523, respectively. Such operation is repeated to connect each pin pair to each other one by one until all pairs of pins are completely connected to each other. When all pairs of pins are finally connected, wiring operation is finished.

From this fact, it is readily understood that the illustrated automatic router determines interconnection paths or routes with reference to the connection failure data signals which are memorized in the connection failure area 523 and which are accessed by the connection failure detecting portion 512.

Now, the operation of the automatic router illustrated in FIGS. 1 and 2 will be described more in detail hereinunder.

Figure 3:
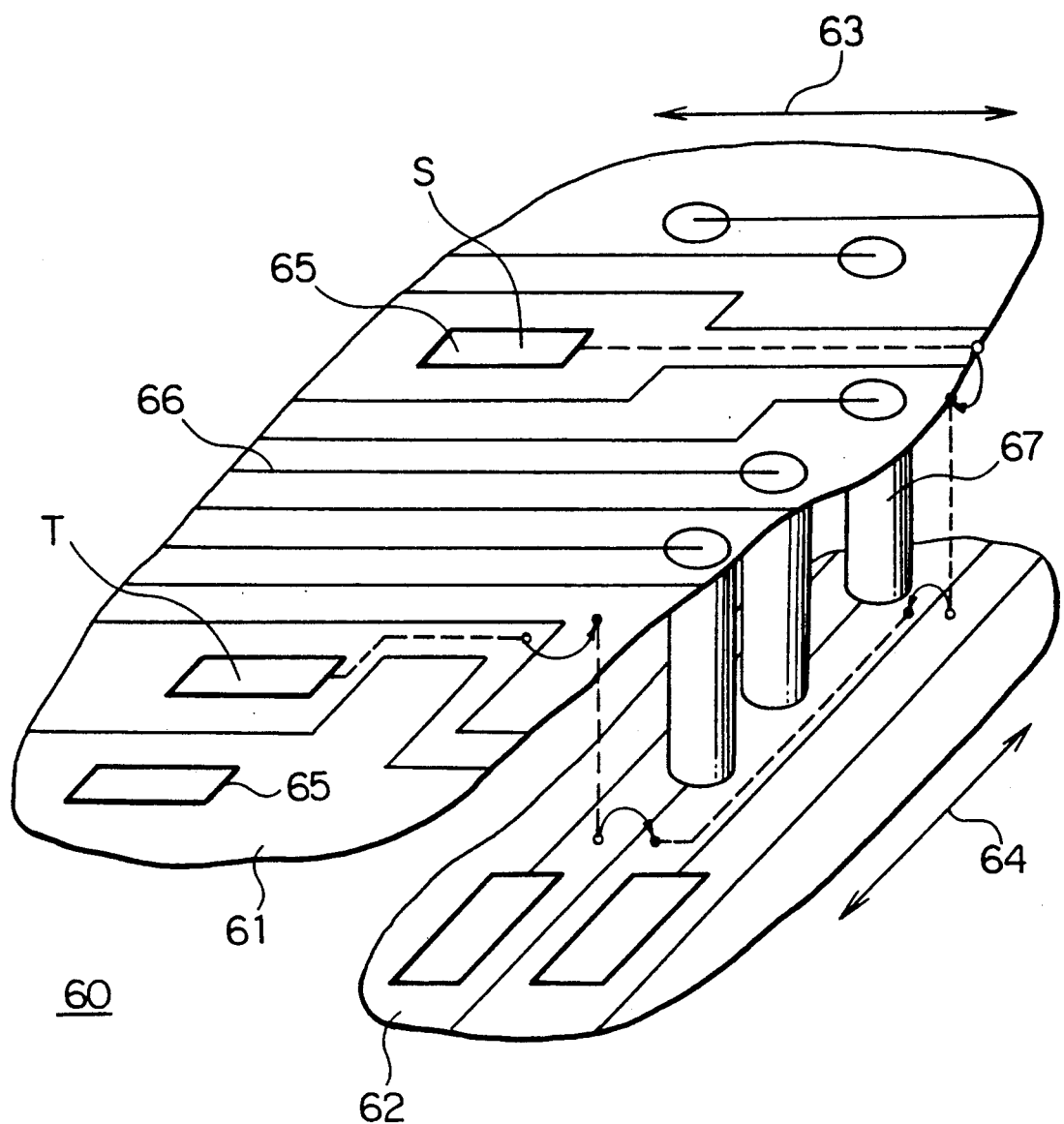
FIG. 3 shows a partial perspective view of a print circuit board to which this invention is applicable.

Referring to FIG. 3, a printed circuit board depicted at 60 is exemplified which is capable of carrying out interconnections in accordance with this invention. The illustrated printed circuit board 60 is composed of a first or an upper layer 61 and a second or an underlying layer 62. On the first and the second layers 61 and 62, first and second dominant directions are determined as indicated by arrows 63 and 64 and are orthogonal to each other. In the example being illustrated, the first dominant direction 63 is directed between righthand and lefthand sides of FIG. 3 while the second dominant direction 64 is directed between front and rear sides thereof.

The first layer 61 has component terminals (collectively depicted at 65), connection conductors 66 extended along the first dominant direction 63, and via holes 67 extended through the first layer 61. A start terminal S and an end terminal T are selected from the component terminals 65. The second layer 62 has conductor patterns like the first layer 61. The connection conductors on the second layer 62 are extended along the second dominant direction 64. Let an electrical connection or wiring be determined between the start and the end terminals S and T by the automatic router, as illustrated by a broken line.

Memory Circuit 52

(a) Wiring position area 521

Figure 4A:
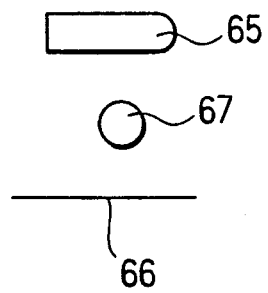
FIG. 4(A) and 4(B) show connection components or elements used in the print circuit board and a wiring unit formed by the connection elements.

Referring to FIG. 4(A) together with FIG. 1, the wiring position area 521 memorizes a species of components, such as the connection conductors 66, the via holes 67, and the connection conductors 65, as illustrated in FIG. 4(A), positions of the components, and configurations in the form of data signals. The species of components, the positions of the components, and the configurations are memorized as species data signals, position data signals, and configuration data signals, respectively, which will collectively be called the wiring position data signals, as mentioned before.

Practically, the wiring position area 521 is divided into first and second parts which memorize the above-mentioned wiring position data signals and provisional wiring position data signals, as will later be described.

At any rate, the wiring position data signals are memorized in the first part of the wiring position area 521 of the memory circuit 52.

(b) Wiring unit area 522

Figure 4B:
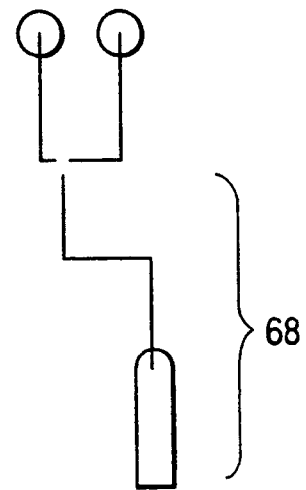

Referring to FIG. 4(B) in addition to FIG. 1, the wiring unit area 522 is loaded with wiring unit data signals which are obtained by dividing the wiring position data signals of each layer 61 and 62 (FIG. 3) into a plurality of wiring units. In addition, each wiring unit data signal includes a pair of end point data signals representative of end points which may be, for example, the via holes, the component terminal, or a branch point, as illustrated in FIG. 4(B). Therefore, an interconnection as depicted at 68 in FIG. 4(B) is represented by each wiring unit data signal.

Thus, each wiring unit data signal comprises a concatenation or a chain of the wiring position data signals together with pointers which point out adjacent ones of the wiring position data signals. When a certain pointer points out adjacent one of the wiring position data signals, another pointer points out the certain pointer. This means that each wiring unit data signal has a pointer or pointers which bidirectionally points out the other wiring unit data signal or signals one another.

Figure 5:
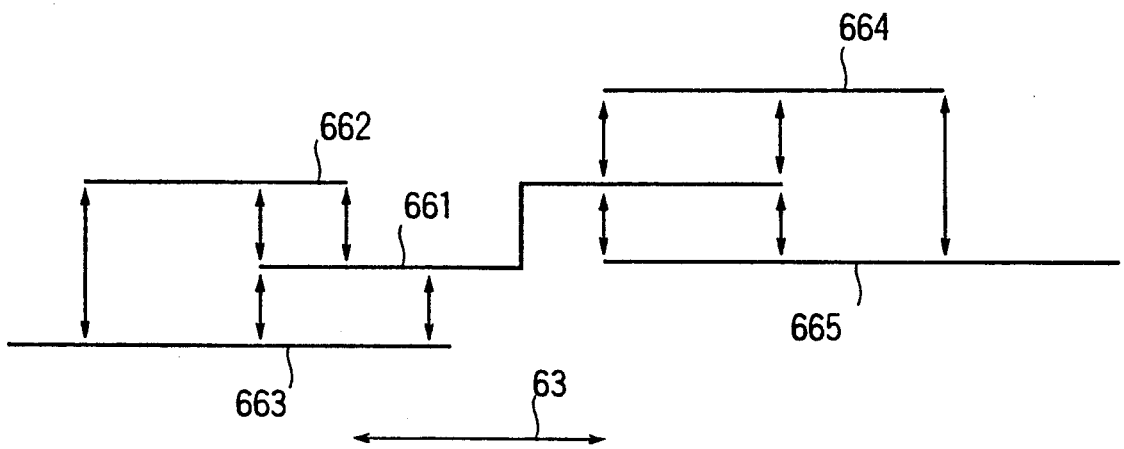
FIG. 5 shows an example of a wiring pattern comprising a plurality of connection conductors along with relationships between them.

Referring to FIG. 5, the connection conductors 661 to 665 are arranged along the dominant direction depicted at 63 on a single layer with both ends of each connection conductor 661 to 665 terminated by via holes or part terminals (not shown in FIG. 5). A first or center one of the connection conductors 661 to 665 is adjacent to second and third ones of the connection conductors 662 and 663 on the lefthand side of FIG. 5 in a direction orthogonal to the dominant direction and similarly adjacent to fourth and fifth ones of the connection conductors 664 and 665 on the righthand side thereof.

The lefthand end of the first connection conductor 661 is represented by a pointer which is held in the wiring unit data signal for the first and the third connection conductors 662 and 663 and which is also held in the wiring unit data signals for the second and the third connection conductors 662 and 663, as symbolized by arrows. Likewise, the lefthand end of the second connection conductor 662 is specified by the pointer which is held in the wiring unit data signals for the second and the third connection conductors 662 and 663 and which is held in the wiring unit data signals for the first connection conductor 661. Similarly, the remaining pointers are also included in the wiring unit data signals for adjacent ones of the connection conductors. Thus, the wiring unit data signals include the pointers which bidirectionally point out the other wiring unit data signals, as symbolized by arrows.

In addition, the wiring unit data signals to be connected to each other also include the pointers which bidirectionally point out each other.

Figure 6:
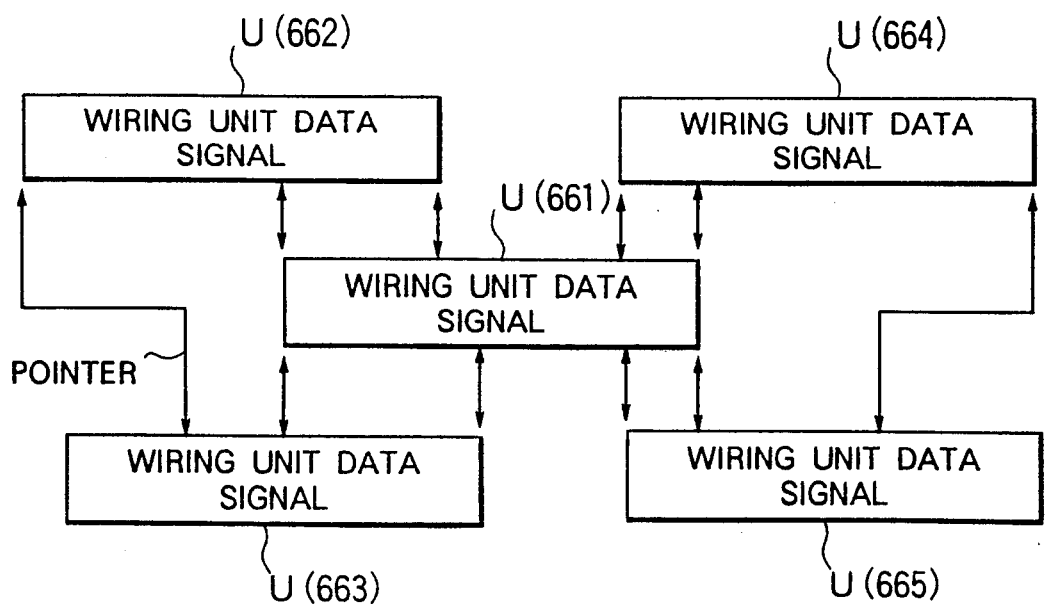
FIG. 6 shows relationships among data signals derived from the wiring pattern illustrated in FIG. 5.

Referring to FIG. 6, the wiring unit data signals are derived from the first through the fifth connection conductors 661 to 665 and are depicted at U(661) to U(665), respectively. Each wiring unit data signal includes the pointers, as symbolized by arrows, and are related to one another by the pointers.

At any rate, the wiring unit data signals are memorized in the wiring unit area 522.

(C) Connection failure area 523

The connection failure area 523 is for memorizing cross point data signals which are classified into channel failure data signals and terminal network data signals, as will become clear. As used herein, the term "connection failure" indicates an impossibility of inserting a wiring into a bundle of wirings, as will become clear as the description proceeds.

Figure 7:
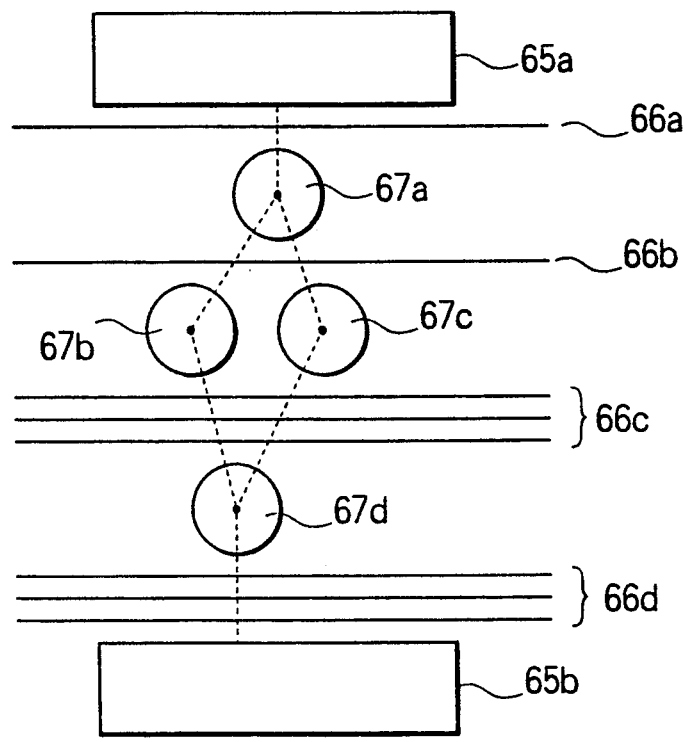
FIG. 7 shows a wiring pattern for use in describing channel failure data signals.

Referring to FIG. 7, first and second terminals 65a and 65b, first through fourth connection conductors 66a to 66d, and first through fourth via holes 67a to 67d are arranged on a single layer. The first through the fourth via holes 67a to 67d illustrated in FIG. 7 can be neither interconnected to one another nor interconnected to the first and the second terminals 65a and 65b, as shown by broken lines. In other words, the first through the fourth via holes 67a to 67d fail to be connected to one another and to the terminals 65a and 65d due to presence of the connection conductors 66a to 66d. Specifically, a new wiring cannot be inserted between each of the via holes 67a to 67d and each of the terminals 65a and 65b because each of the connection conductors 66a and 66d are already inserted therebetween in the form of a bundle of wiring, as illustrated in FIG. 7.

Under the circumstances, failure of the interconnections is represented by the channel failure data signals. In this connection, each of the channel failure data signals specifies the via hole or holes, the terminal or terminals, and the connection conductor or conductors between the terminals, between the via holes, or between the terminal and the via hole. Therefore, the channel failure data signals include the wiring position data signals and the species of the via holes and the terminals and a pointer which indicates the wiring unit data signals for the connection conductor or conductors laid between the via holes or the terminals.

On the other hand, the wiring unit data signals pointed by the pointer of the channel failure data signals also includes a pointer which points the channel failure data signals in question.

Figure 8:
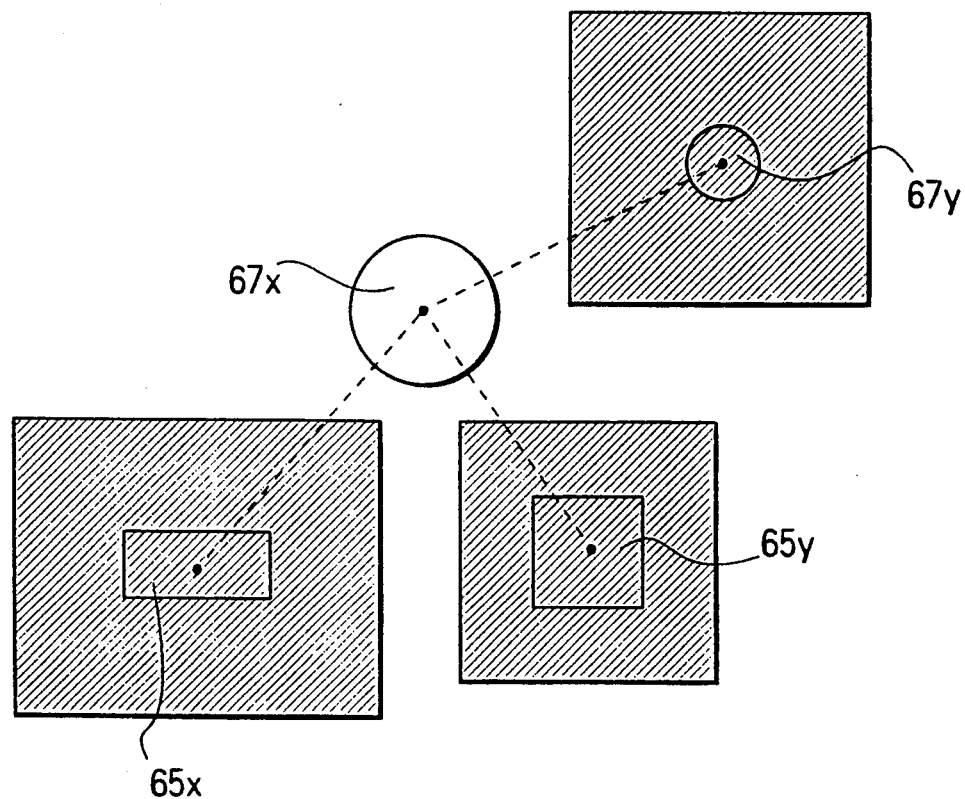
FIG. 8 shows a wiring pattern for use in describing terminal network data signals.

Referring to FIG. 8, a single via hole 67x is located and is adjacent to another via hole 67y and terminals 65x and 65y that are called an adjacent via hole 67y and adjacent terminals 65x and 65y, respectively, although any connection conductor may be adjacent to the via hole 67x. In FIG. 8, the adjacent elements and the related connection conductors are symbolized by rectangular shapes with the connection conductors omitted from FIG. 8. Specifically, the size of each of the rectangular shapes specifies the size of a bundle formed by the connection conductors laid between the elements 67y, 65x, and 65y and the via hole 67x. Terminal network data signals are formed when the adjacent elements and the via hole 67x overlap in horizontal and vertical directions within regions of the rectangular shapes, as will be mentioned hereinafter. No connection conductor is laid between the via hole 67x and the adjacent elements, such as 67y, 65x, and 65y. In this event, the via hole 67x is not spaced apart from the adjacent elements by a predetermined distance which is left therebetween and which is decided in accordance with a preselected rule, as will become clear. Under the circumstances, such relationships between the via hole 67x and the adjacent elements are represented by the terminal network data signals. Specifically, the terminal network data signals include pointers which point out the adjacent via hole 67 and the terminals 65x and 65y. The pointers may include a pointer pointing out adjacent connection conductor or conductors. However, such terminal network data signals may be attached only to the wiring unit data signals for the via holes and the terminals except the connection conductor.

Figure 9:
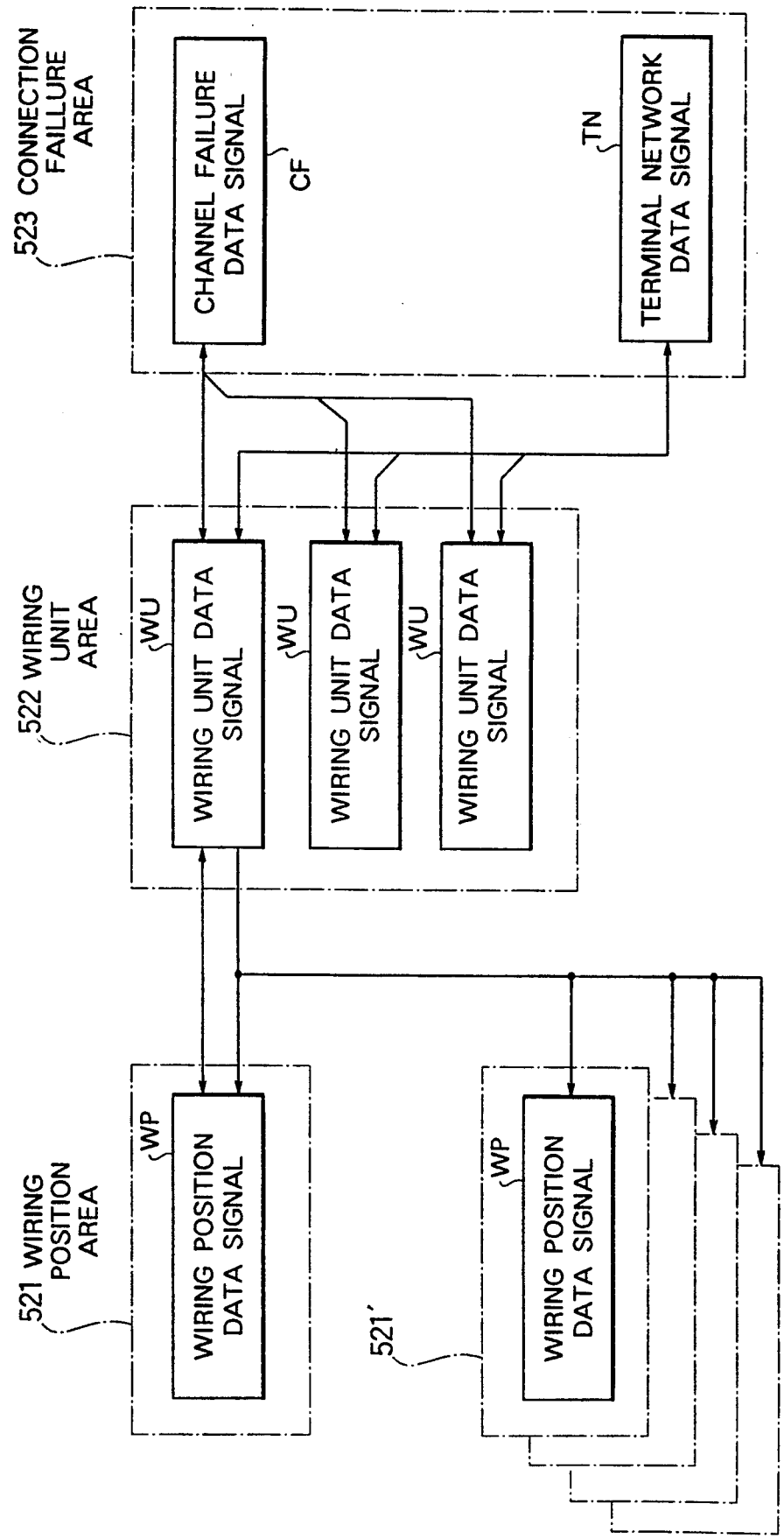
FIG. 9 shows a block diagram for use in describing relationships among data signals used in the automatic router illustrated in FIG. 1.

Referring to FIG. 9, the memory circuit 52 is divided into the connection failure area 523, the wiring unit area 522, and the wiring position area 521 which can be accessed to one another, as shown by arrows. The connection failure area 523 memorizes the channel failure data signals and the terminal network data signals while the wiring unit area 522 memorizes the wiring unit data signals, as mentioned before. The wiring position area 521 is divided into first and second areas for the wiring position data signals. The second area is for memorizing the wiring position data signals concerned with provisional wiring positions which will be described later.

Control circuit 51

(a) Connection failure detecting portion 512

Figure 10:
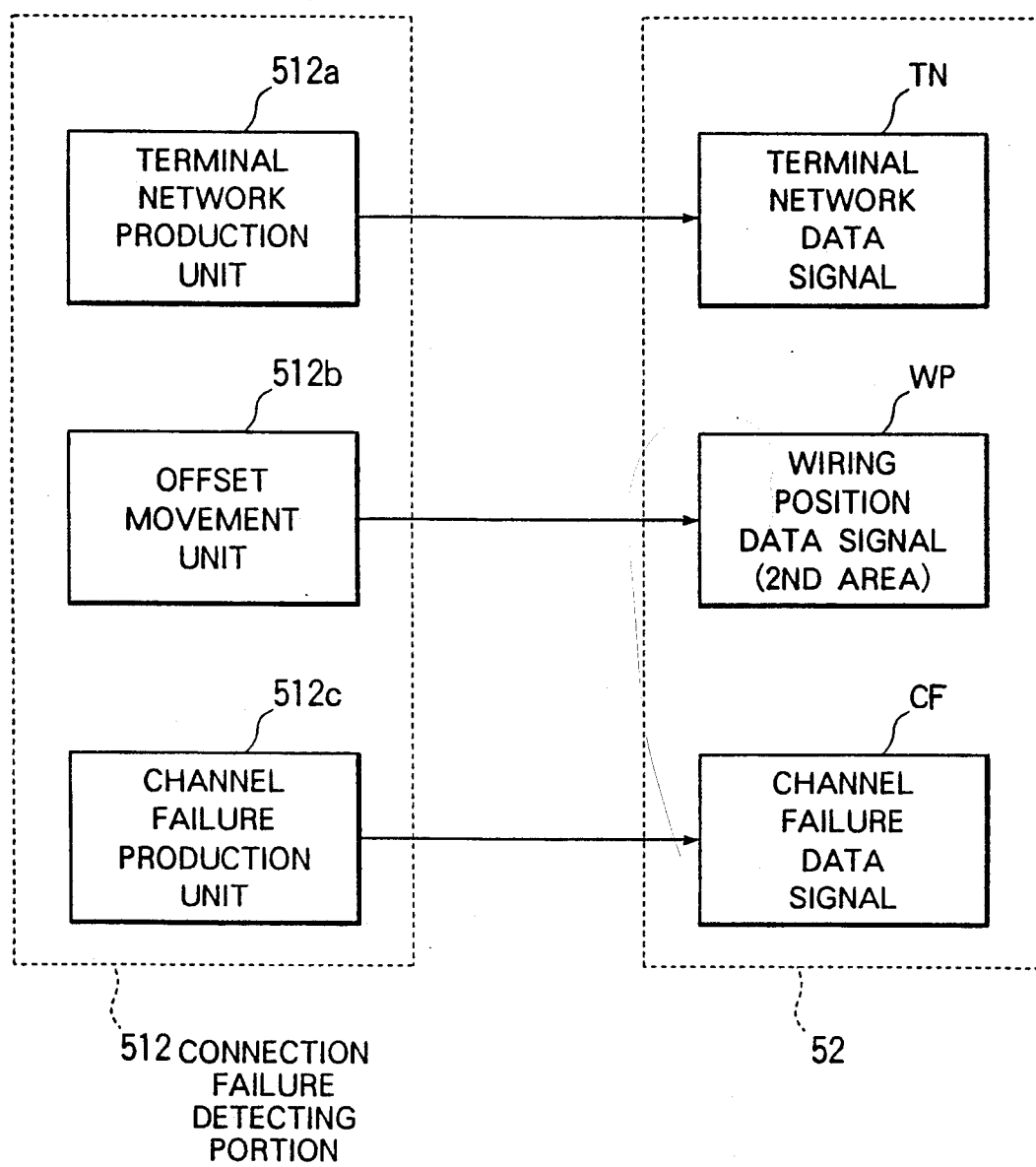
FIG. 10 shows a block diagram of a connection failure detecting unit included in the automatic router illustrated in FIG. 2.

Referring to FIG. 10, the connection failure detecting portion 512 is at first described prior to the path searching portion 511 because the path searching portion 511 is operable with reference to results of detection obtained by the connection failure detecting portion 512. Specifically, the connection failure detecting portion 512 has a terminal network production unit 512a, an offset movement unit 512b, and a channel failure production unit 512c, all of which may be structured by software programs and which deliver the terminal network data signals TN, the wiring position data signals WP, and the channel failure data signals CF to the memory circuit 52.

(1) Terminal network production unit 512a

Referring to FIG. 8 again together with FIGS. 1 and 10, the terminal network production unit 512a is operable to make up the terminal network data signals in connection with the terminals and the via holes. As mentioned before, the terminal network data signals define the relationships between each via hole and each terminal or connection conductor.

In FIG. 8, it is assumed that the relationship between the via hole 67x and the other adjacent elements, such as 67y, 65x, and 65y is represented by the terminal network data signals. In this event, the terminal network production unit 512a selects the via hole 67x and accesses the wiring position area 521 (FIG. 1) to read the wiring position data signals of the adjacent elements, such as 67y, 65x, and 65y. Such wiring position data signals are derived from the wiring position area 521 at every layer. The terminal network production unit 512a carried out processing among the wiring position data signals so that the via hole 67x is connected to the adjacent elements 67y, 65x, and 65y by line segments depicted at broken lines. Thereafter, the terminal network production unit 512a calculates a width of a connection conductor intersecting each line segment to sum up the width and an acceptable minimum gap space left between the connection conductor and the via hole 67x and to obtain a bundle width Bw of connection lines. Herein, a size of each of the via hole 67y and the terminals 65x and 65y is assumed to be represented by Sz. Under the circumstances, rectangles are formed about each element 67y, 65x, and 65y and have centers coincident with the via hole 67y and the like.

Each side Sd of the rectangles is given by:

$$Sd = Sz + Bw \times 2. \quad (1)$$

It is surmised that positions of the via hole 67x and the rectangles are represented on a rectangular coordinate by horizontal and vertical components. Under the circumstances, the terminal network production unit 512a judges whether or not coordinate components of the via hole 67x fall within ranges of the rectangles. In other words, judgement is made whether or not the horizontal and the vertical components of the via hole 67x are superposed on those of the adjacent elements.

If the coordinate components of the via hole 67x are superposed on the ranges of the adjacent elements, such as 67y, 65x, and 65y, the terminal network data signals are made up so as to specify relationships between the via hole 67x and each adjacent element. Specifically, when the horizontal components are superposed between the via hole 67x and the adjacent elements as specified by terminals 65x and 65y, vertical direction terminal network data signals TNv are defined between the via hole 67x and each of the terminals 65x and 65y. On the other hand, when the vertical components are superposed, as apparent from the via hole 67x and the via hole 67y, horizontal direction terminal network data signals $TN_H$ are defined therebetween.

Figure 11:
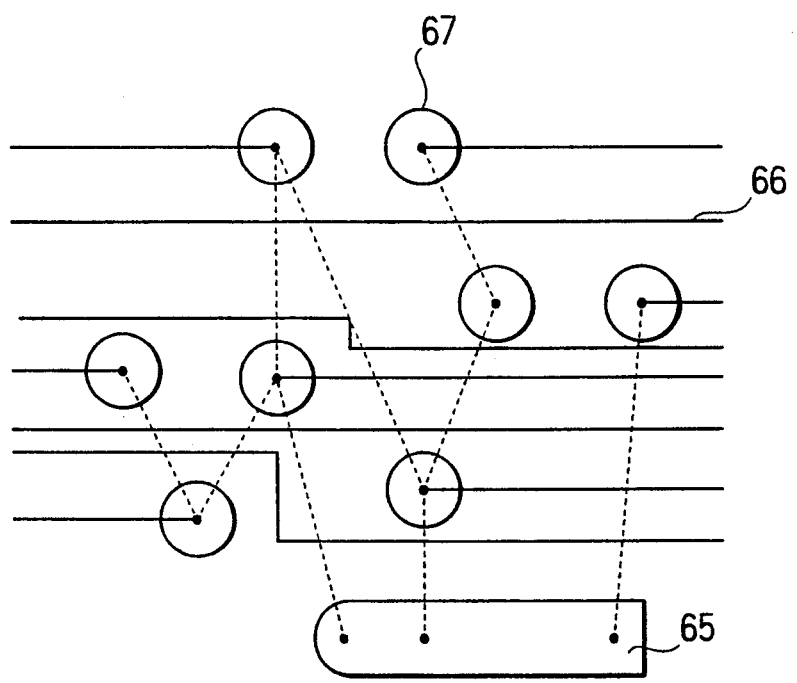
FIG. 11 shows a wiring pattern for use in describing operation of the connection failure detecting unit illustrated in FIG. 10.

Referring to FIG. 10, the terminal network data signals also represent relationships between the via holes 67 and the terminals specified by 65. More specifically, when a certain via hole 67 is moved in a vertical or a horizontal direction, let another via hole or terminal be also moved through a connection conductor 66. Such relationships are shown by broken lines in FIG. 11 and are represented by the terminal network data signals. In this case, the terminal network data signals include pointers which point out via holes located on both ends, the terminal, and the wiring unit data signal representative of the connection conductors among them. At any rate, such terminal network data signals are memorized in the memory unit 52.

(2) Offset movement unit 512b

Figure 12:
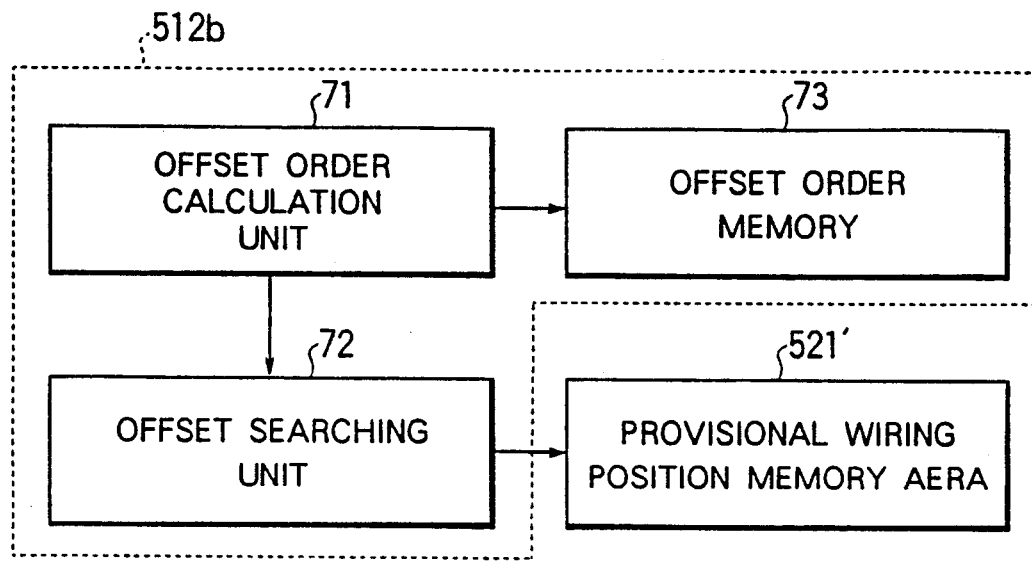
FIG. 12 shows a block diagram of an offset movement unit included in the connection failure detecting unit illustrated in FIG. 11.

Referring to FIG. 12 together with FIG. 10, the offset movement unit 512b is operable to produce the wiring position data signals and to memorize them into the second area of the wiring position area 521 (FIG. 1). To this end, the offset movement unit 512b comprises an offset order calculation unit 71 and an offset searching unit 72 both of which may be formed by a software program and which are operable in a manner to be described later in detail. In addition, the offset order calculation unit 71 is operable in cooperation with an offset order memory 72 which may be included in the control circuit 51.

Figure 13:
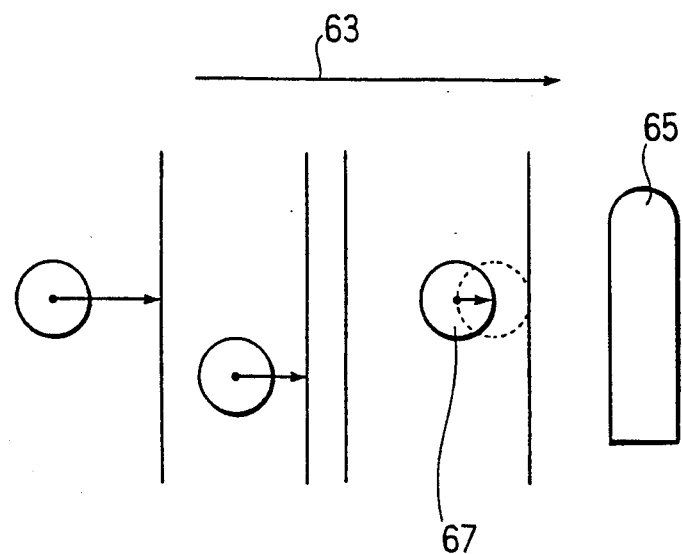
FIG. 13 shows a wiring pattern for use in describing operation of the offset movement unit illustrated in FIG. 12.

Referring to FIG. 13, description will be made about an offset movement for a better understanding of this invention. On carrying out the offset movement, an offset direction 75 and a via hole 67 are indicated to move the via hole 67 in the offset direction 75. In this case, the other via holes are also moved together with the via hole 67 in question in the offset direction as designated by arrows. As a result, the via holes are located at offset positions, respectively. Thereafter, wiring position data signals are derived from the offset positions of the via holes and are used for determining provisional wiring positions, as will become clear as the description proceeds.

Offset order calculation unit 71

Figure 14:
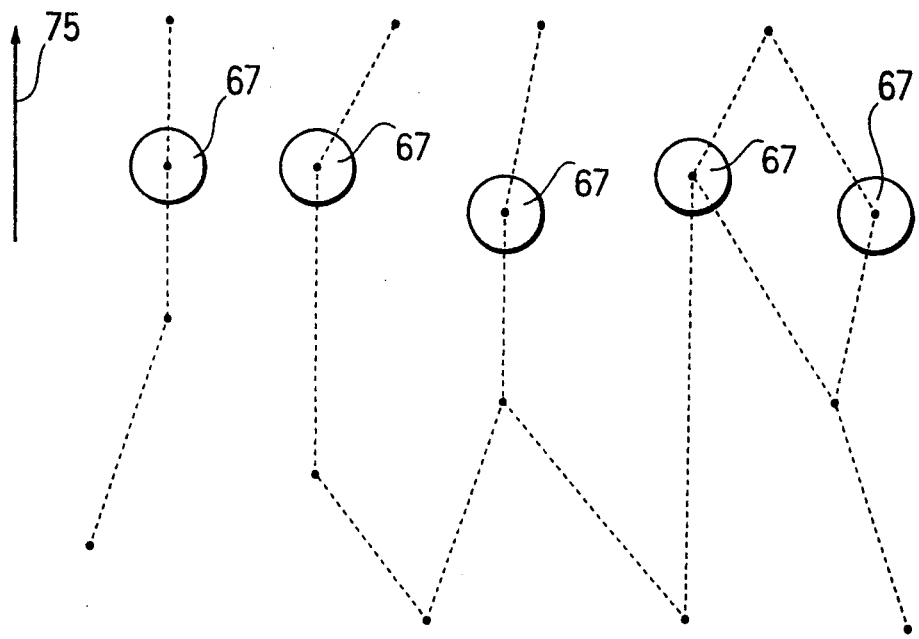
FIG. 14 shows another wiring pattern for use in describing operation of the offset movement unit illustrated in FIG. 12.

Referring to FIG. 14, description will be made about operation of the offset order calculation unit 71. In FIG. 14, the offset direction 75 and the via holes 67 are assumed to be indicated. In FIG. 14, each terminal network data signal represents perpendicular broken lines which are connected between via holes. In addition, an omission is made in FIG. 14 as regards the connection conductors which intersect the perpendicular broken lines. Other terminals and via holes are symbolized by dots in FIG. 14. It is also assumed that each via hole is electrically connected by connection conductors (as shown by broken lines) and the other via holes or terminals (as shown by dots) and that the terminal network data signals are derived from such connection conductors and other via holes or terminals that may be called other elements. Under the circumstances, the offset order calculation unit 71 successively reads the terminal network data signals in connection with the other elements located in the offset direction. Subsequently, the terminal network data signals are read in connection with the other elements that are located in a direction opposite to the offset direction. Thus, the readout operation in the opposite direction is successively continued until the terminal network extending along the perpendicular direction is terminated. Consequently, the terminal network data signals are read out about all the elements located in the opposite direction.

Thereafter, the offset order calculation unit 71 arranges the via holes 67 included in the terminal network data signals in an order nearest to the offset direction and produces offset order data signals including pointers indicative of the order of the via holes 67. The offset order data signals are memorized in the offset order memory 73 (FIG. 12).

Offset searching unit 72

In FIG. 12, the offset searching unit 72 moves each via hole 67 in the offset direction in the order indicated by the offset order data signals. In this case, each via hole 67 indicated by the pointer is moved to a maximum limit by the use of the terminal network data signals until a space gap between each via hole 67 and another via hole or terminal positioned at another end becomes equal to that bundle width Bw of the connection conductor which is indicated by the terminal network data signals. Subsequently, the offset searching unit 72 forms the wiring position data signal indicative of a position of each via hole moved and memorized the wiring position data signal into the second area of the memory circuit 52. The wiring position data signal in consideration serves to determine a provisional wiring path and therefore, the second area may be called a provisional wiring position memory area 521', as labelled in FIG. 12.

In addition, the offset searching unit 72 adds the wiring unit data signal pointed out by the pointer of the wiring position data signal indicative of a previous position of each via hole, to a new pointer for indicating a new wiring position data signal. The above-mentioned operation is successively carried out in the order of the offset order data signals by the offset searching unit 72.

(c) Channel failure production unit 512c

Referring back to FIGS. 7 and 10, the channel failure production unit 512c indicates the via hole 67 or the terminal 65 (suffix omitted) to form the channel failure data signal concerned with the via hole or the terminal in question and to memorize it into the connection failure area 523. To this end, the channel failure production unit 512c judges whether or not a channel failure takes place between the elements, such as the via holes, the terminals. More specifically, the channel failure production unit 512c at first indicates one of the elements to calculate a bundle width Bw between the one element and an element adjacent to the one element. Subsequently, calculation is carried out to obtain a rectangle which is drawn around the adjacent element and which has a side Sd given by:

$$Sd = Sz + Bw \times 2 + W \times 2 + Gm \times 2, \tag{2}$$

where W is representative of a width of the connection conductor inserted between the elements under consideration and Gm, an acceptable minimum gap.

Figure 15A:
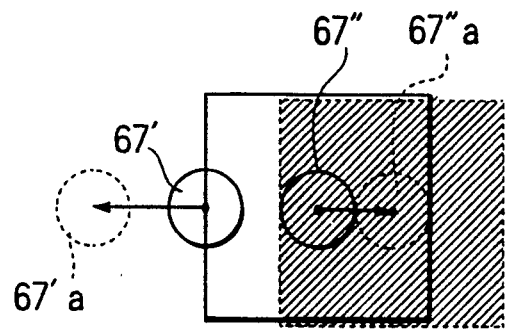
FIGS. 15(A) and 15(B) shows wiring patterns for use in describing operation of deriving channel failure data signals.

Referring to FIG. 15(A), the one element and the adjacent element are via holes depicted at 67' and 67" which may be referred to as one and adjacent via holes, respectively. As shown in FIG. 15(A), a rectangle 77 drawn around the adjacent via hole 67" is superposed on the one via hole 67'. In this event, the channel failure production unit 512c read, out of the provisional wiring position memory area 512' (FIG. 12), following wiring position data signals representative of following positions at which the one and the adjacent via holes 67' and 67" are further spaced apart from each other. In order to derive the following wiring position data signals, the one and the adjacent via holes 67' and 67" are moved to the following positions, as broken lines in FIG. 15(A). In this connection, via holes located at the following positions are represented by 67'a and 67"a which may be called provisional via holes, respectively. Under the circumstances, judgement is made whether or not the provisional one via hole 67'a is superposed on a rectangle drawn around the provisional adjacent via hole 67"a. As illustrated in FIG. 15(A), no channel failure data signal is produced by the channel failure production unit 512c when no superposition occurs between the provisional via holes 67'a and 67"a.

Figure 15B:
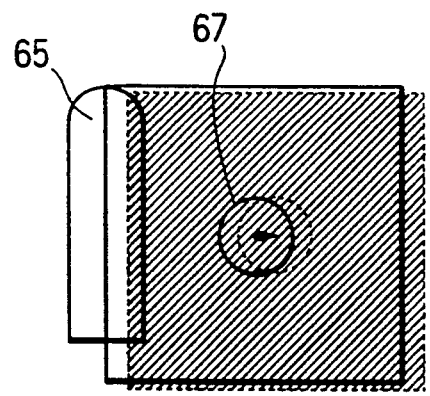

Referring to FIG. 15(B), the one and the adjacent elements are represented by a terminal and a via hole 65 and 67, as depicted at real lines. Let the terminal 65 and the via hole 67 be moved at maximum to broken line positions. In spite of the movement, the terminal 65 is superposed on the via hole 67. In this case, the channel failure production unit 512c forms the channel failure data signals in connection with the terminal 65 and the via hole 67.

In the channel failure production unit 512c, following channel failure data signals are successively formed from both ends at which the channel failure data signals are produced, as shown in FIG. 7.

Path searching portion 511

Figure 16:
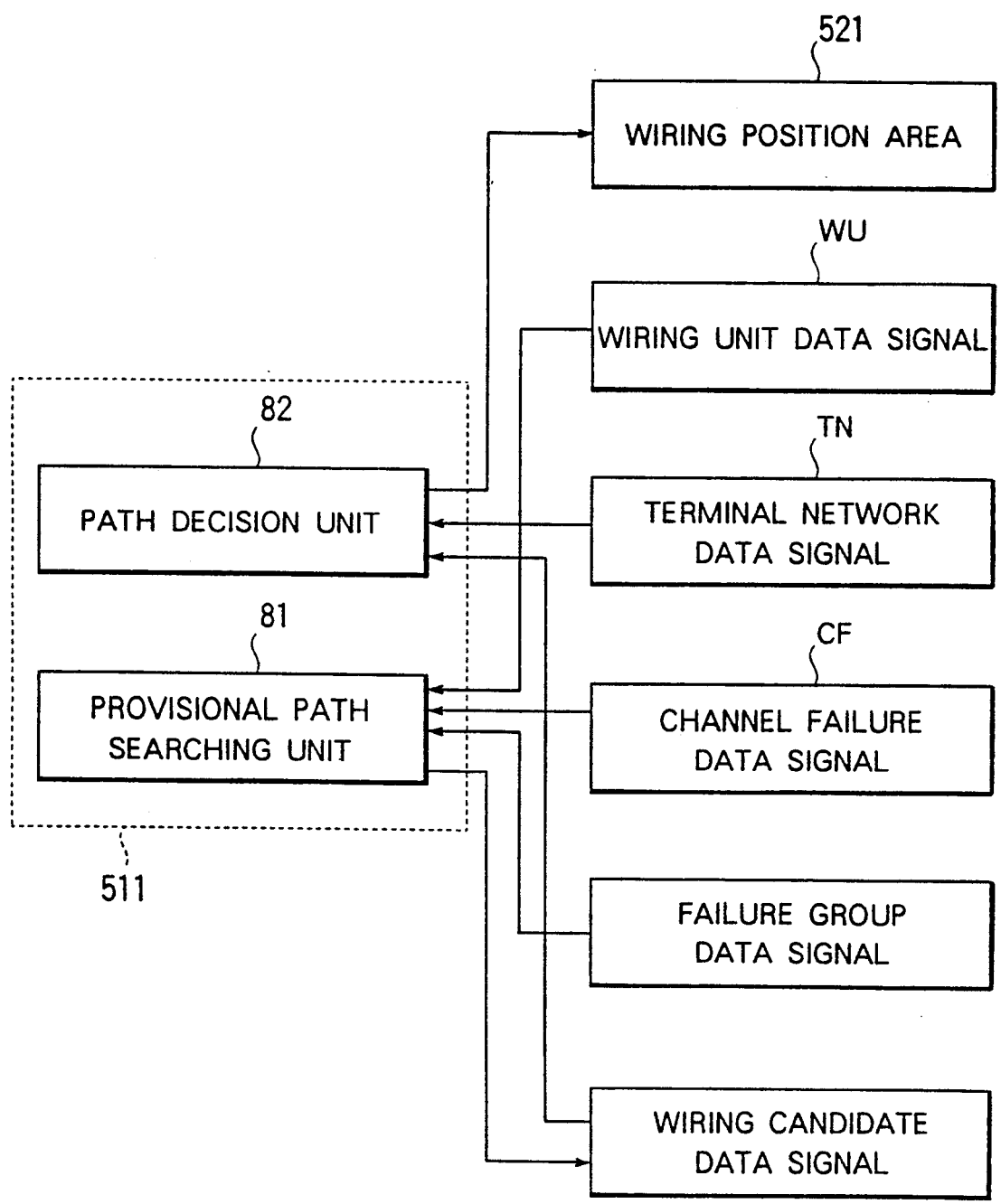
FIG. 16 shows a block diagram of a path searching portion illustrated in FIG. 2.

Referring to FIG. 16, the path searching portion 511 comprises a provisional path searching unit 81 and a path decision unit 82.

(a) Provisional path searching unit 81

Figure 17:
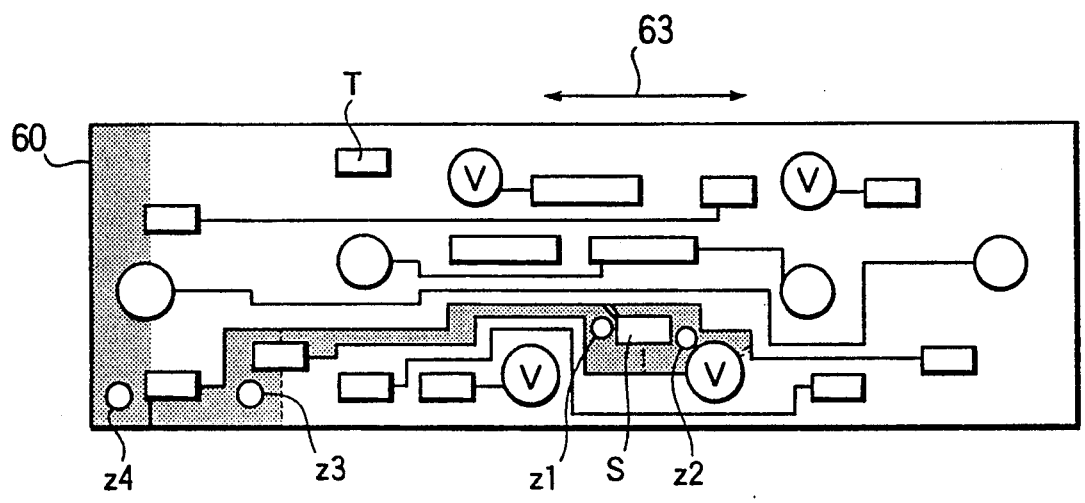
FIG. 17 shows a plan view of a specific wiring pattern arranged on a first layer of a print circuit board.
Figure 18:
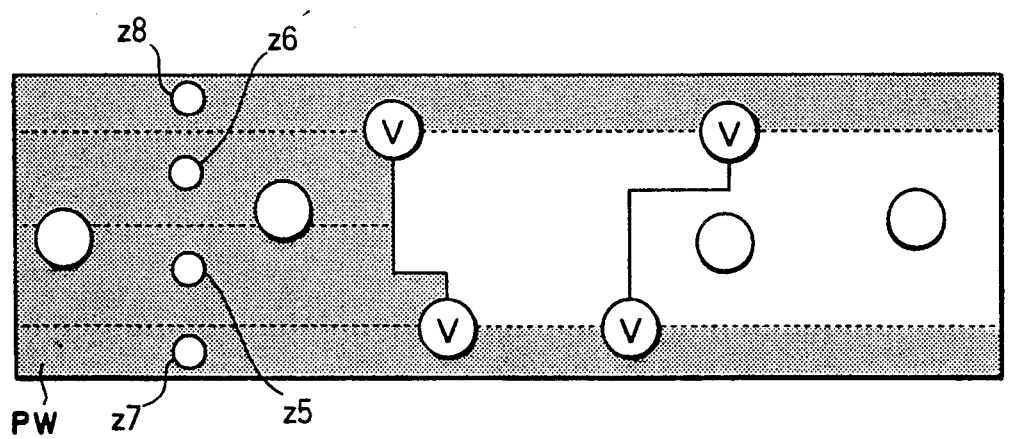
FIG. 18 shows a plan view of a second layer of the print circuit board connected to the first layer illustrated in FIG. 17.

Referring to FIG. 3 together with FIGS. 17 and 18, the provisional path searching unit 81 is operable in response to a pair of data signals which is indicative of the start point S and the end point T and which will be referred to as pin pair data signals, to search for provisional wiring zones, as illustrated by hatched portions in FIGS. 17 and 18. The provisional wiring zones in FIGS. 17 and 18 are assumed to be formed on first and second layers of the printed circuit board, as illustrated in FIG. 3. In other words, a bundle of paths is collectively searched by the provisional path searching unit 81 on the assumption that any via holes and connection conductors are inserted between the start and the end points S and T. The provisional wiring zones are memorized into the memory circuit 52 in the form of provisional wiring zone data signals.

Figure 19:
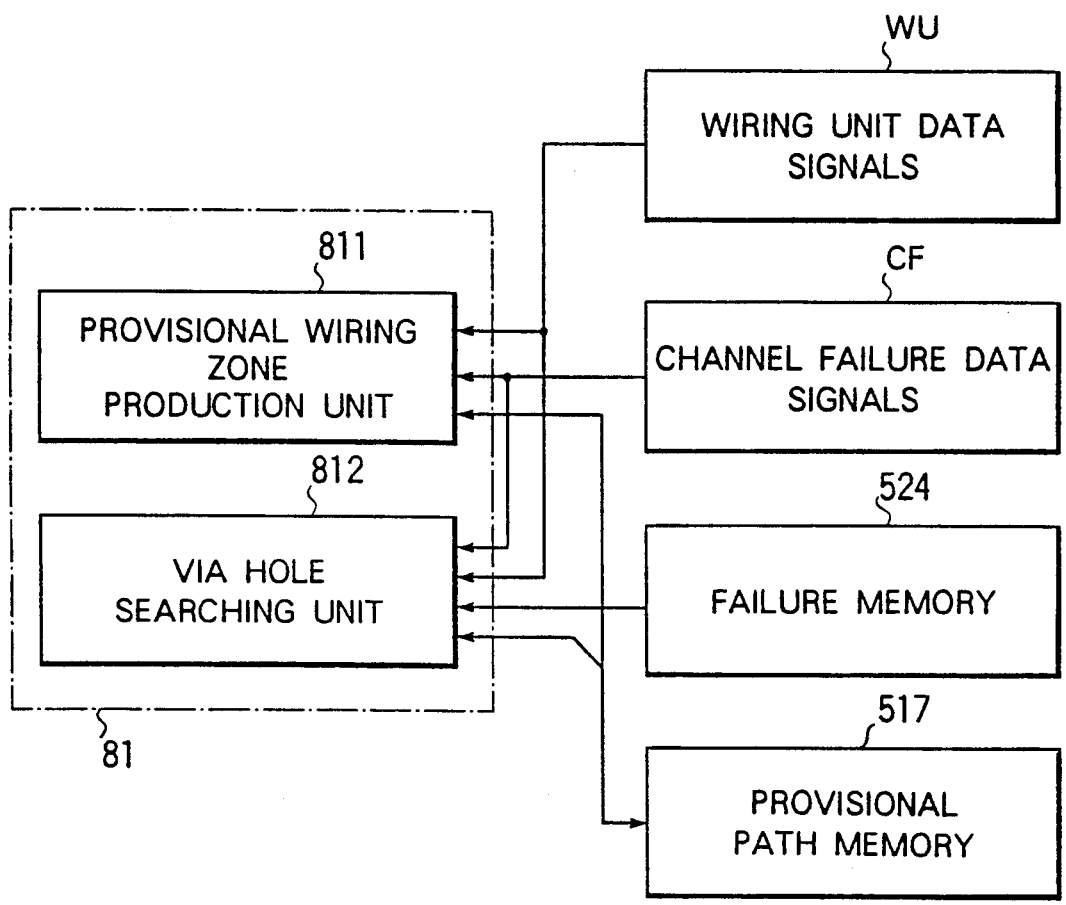
FIG. 19 shows a block diagram for use in describing operation of a provisional path searching unit illustrated in FIG. 16.
Figure 20:
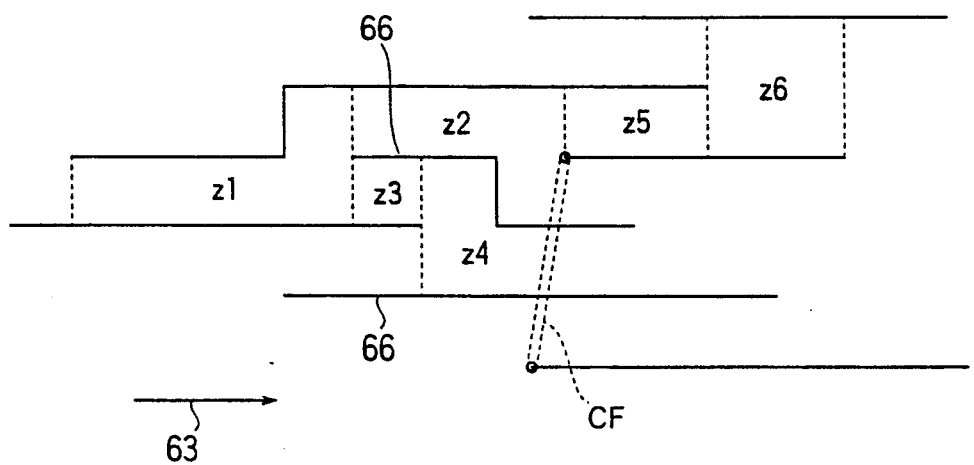
FIG. 20 shows a wiring pattern obtained by symbolizing the specific wiring pattern illustrated in FIG. 18.

Referring to FIGS. 19 and 20, the provisional path searching unit 81 comprises a provisional wiring zone production unit 811 and a via hole searching unit 812. Specifically, a wiring pattern as illustrated in FIG. 20 comprises a plurality of connection conductors 66 which are individually connected to via holes and terminals (not shown in FIG. 20) which are spaced apart from one another with a spacing left therebetween. Each combination of the connection conductor, the via hole, and/or the terminal is represented by the wiring unit data signal which includes the pointers indicating adjacent one or ones of the combinations. In the example being illustrated, the channel failure data signals are derived from the illustrated wiring pattern as symbolized by double broken line indicated at CF.

Under the circumstances, the provisional wiring zone production unit 811 produces unit zone data signals representative of unit zones. As shown in FIG. 20, the unit zone data signals are obtained by dividing the spacing into first through sixth unit zones (depicted at 1 through 6) by the pointers indicated by the wiring unit data signal and the pointers indicated by the channel failure data signals.

Figure 21:
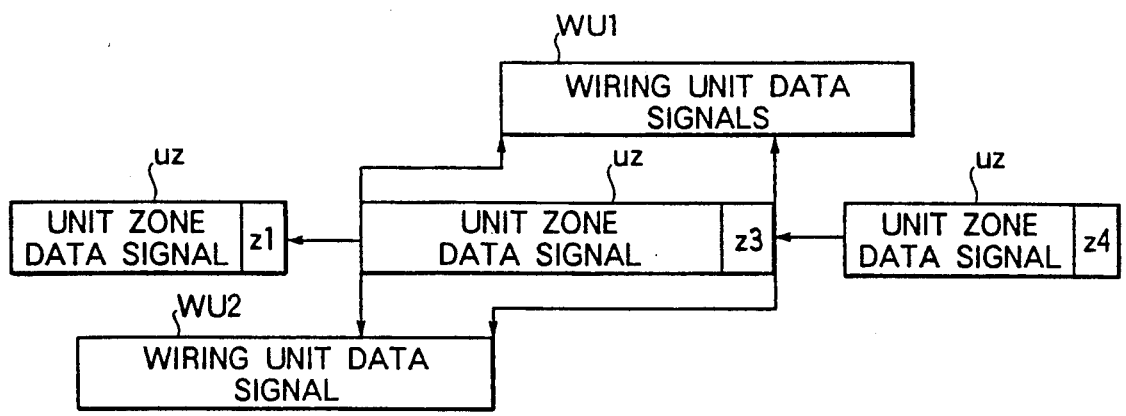
FIG. 21 shows a data structure obtained by the wiring pattern illustrated in FIG. 20.

As shown in FIG. 21, each unit zone data signal has the pointers which point out the wiring unit data signals located at both ends of each unit zone. Specifically, the unit zone data signal for the third unit zone includes the pointers for pointing out the wiring unit data signals depicted at $WU_1$ and $WU_2$. In addition, each unit zone data signal also includes the pointer which indicates the unit zone located on the side of the start point S. In FIG. 21, it is assumed that the starting point S is located at the left side end of each zone. In this connection, a unit zone which is placed on the right side of the unit zone specified by the unit zone data signal (z4) cannot indicate the unit zone data signal z4 as a unit data signal which is present on the side of the start point S. It is to be noted that no pointer is added to the unit zone data signal for the fourth unit zone (4) to indicate a unit zone located on the side of the start point S. This is because the channel failure or impossibility data signal is formed so that it interrupts a unit zone placed on the right hand side of the fourth unit zone.

Thus, the unit zone data signals are concatenated until they are connected to the end or until they are intercepted by the channel failure data signal. Such concatenation of the unit zone data signals result in formation of the provisional zone data signals, as illustrated in FIGS. 17 and 18.

Via hole searching unit 812

Referring to FIGS. 17 through 19, the via hole searching unit 812 included in the provisional path searching unit 81 (FIG. 16) is for searching for the unit zone data signals which are representative of the unit zone on the second layer (FIG. 18). The unit zone on the second layer is connected through a via hole to each of the unit zones on the first layer (FIG. 17). For this purpose, searching operation is carried out at every one of the unit zone data signals included in that provisional wiring zone data signal of the first layer which is indicative of the provisional wiring zone as shown by the hatched portion in FIG. 17. As shown in FIG. 19, the via hole searching unit 812 is operable in cooperation with a failure memory 524 included in the memory circuit 52, although not shown in FIG. 1. The failure memory, namely, a failure table 524 memorizes failure unit zone signals representative of failure unit zones at which interconnection fails to be carried out.

Figure 22A:
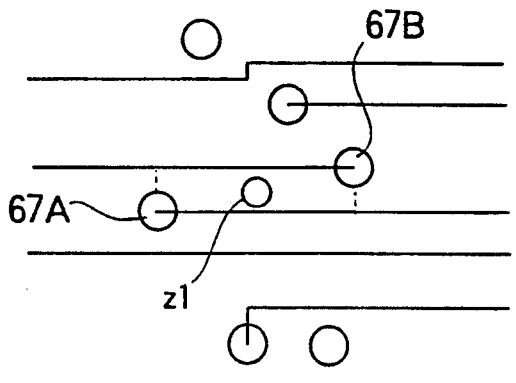
FIGS. 22(A) and 22(B) show a relationship between wiring patterns on different layers.
Figure 22B:
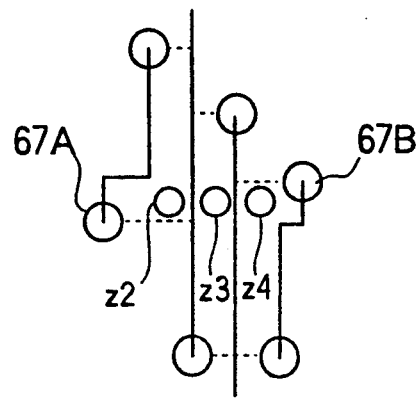

Turning to FIGS. 22(A) and (B), wiring patterns are arranged on the first and the second layers of the printed circuit board, respectively. On the first layer, via holes 67A and 67B are located to define a specific unit zone which is depicted at z1 in FIG. 22(A) and which is represented by a specific unit zone data signal. Under the circumstances, the via hole searching unit 812 accesses the failure memory 524 (FIG. 19) to compare the specific unit zone data signal on the first layer with each failure unit zone signal. As a result of comparison, when the failure unit zone signal is memorized in the failure memory 524 in connection with the specific unit zone z1, the via hole searching unit 812 judges that a via hole can not be inserted within the specific unit zone z1. Otherwise, the via hole searching unit 812 reads the pointers which indicate the via holes 67A and 67B placed at both ends of the specific unit zone z1. The pointers are included in the wiring unit data signals memorized in the wiring unit area 522 (FIG. 1). Subsequently, the second layer is divided on the second layer into second through fourth unit zones depicted at z2 to z4 between the via holes 67A and 67B, as illustrated in FIG. 22(B). Furthermore, judgement is made whether or not a via hole is inserted within the specific unit zone z2 to z4.

Figure 23A:
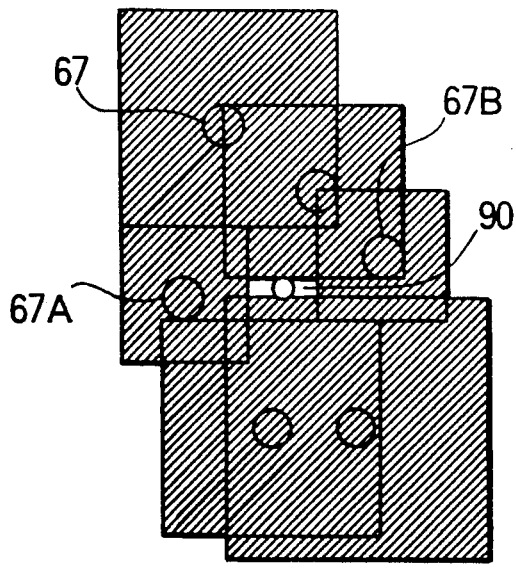
FIGS. 23(A) and 23(B) show operation of the provisional path searching unit to search for a via hole formable area.
Figure 23B:
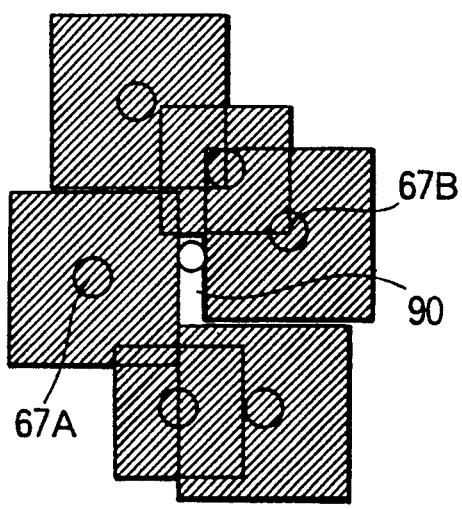

Referring to FIGS. 23(A) and (B), via hole prohibition areas are formed around the via holes illustrated in FIGS. 22(A) and (B) and shown by hatched portions. Such via hole prohibition areas have rectangular shapes which are formed around the via holes or terminals. In this case, a side Sd3 of each rectangular shape is given by:

$$Sd3 = Sz + Bw \times 2 + Vd, \qquad (3)$$

where Sz is representative of a size of the via hole; Bw, the bundle width of connection conductors; and Vd, a diameter of a via hole to be inserted. The bundle width is equal to a sum of an acceptable minimum gap and a width of a connection conductor present between the specific unit area a via hole present at a center area of the via hole prohibition area. In FIG. 23(A), an area depicted at 90 is not covered with all of the via hole prohibition areas of the respective via holes. This shows that a via hole can be formed within the area 90. Accordingly, the area 90 will be called a via hole formable area. A via hole formable area 90 also exists on the second layer in the example illustrated in FIG. 23(B).

On the other hand, when no via hole formable area 90 remains in the specific unit area 21, each via hole is moved from the other via holes so that the via holes are distant from each other at maximum. Such movement of the via holes is carried out by the use of the wiring position data signals read out of the provisional wiring position memory 521′ (FIG. 9). Even when each via hole is moved at maximum, no via hole formable area is present, the via hole searching unit 812 judges that a via hole can not be inserted in the unit zone. In other words, the unit zone in question is judged as a failure unit zone. As a result, the via hole searching unit 812 memorizes the failure unit zone data signal representative of the failure unit zone in question in the failure memory 524 (FIG. 19).

As illustrated in FIG. 23, when the via hole formable area 90 is present in the specific unit zone 21 searching operation of a via hole settable area is carried out in connection with each of the unit zones z3, z3, and z4 on the second layer. For example, the bundle width Bw is calculated in connection with the third unit zone z3 by the via hole searching unit 812. In addition, an aggregation of each via hole prohibition area in the third unit zone z3 is calculated by the via hole searching unit 812. In addition, each union or combination of the via hole prohibition areas is calculated by the via hole searching unit 812 in connection with each of the specific unit zone z1 and another unit zone z3.

Figure 24:
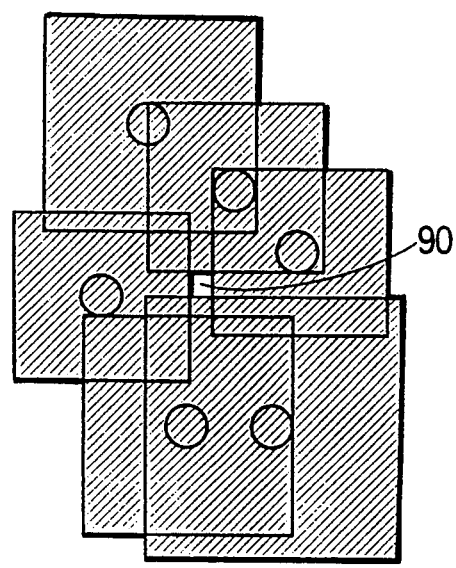
FIG. 24 shows the via hole formable areas searched by the provisional path searching unit.

Referring to FIG. 24, the via hole formable areas 90 are left on the first and the second layers. In this case, it is possible to connect the first unit zone z1 to the third unit zone z3 through the via hole. Under the circumstances, the via hole searching unit 812 attaches, to the unit zone data signal for the third unit zone z3, a pointer which points out the first unit zone z1.

If no via hole formable area is left on each layer, the via hole searching unit 812 memorizes combinations of the unit zones as the unit zone data signals in the failure memory 524.

Similar operation is carried out to search for connectivity between the first unit zone z1 and each of the second and the fourth unit zones z2 and z4. If connection is possible between the first unit zone z1 and each of the second and the fourth unit zones z2 and z4, the via hole searching unit 812 adds, to the unit zone data signals for the second and the fourth unit zones z2 and z4, pointers which point out the first unit zone z1. Thus, the via hole searching operation is finished and followed by operation of the provisional wiring zone production unit 811 of the provisional path searching unit 81.

In this case, the provisional wiring zone production unit 811 makes out the provisional wiring area data signals indicative of the hatched portion of the first layer illustrated in FIG. 17. On the other hand, the via hole searching unit 812 makes out new unit zone data signals which are indicative of new unit zones on the second layer depicted at z5 through z8 in FIG. 18. The provisional wiring zone production unit 811 produces new provisional wiring zone data signals (depicted at PW) again in connection with the new unit zone data signals of the second layer, as illustrated in FIG. 18.

Supplied with the new provisional wiring zone data signals derived from the second layer, the via hole searching unit 812 forms new unit zone data signals in connection with the first layer. This is because connections may be changed on the first layer in dependency upon the new unit zones of the second layer. Subsequently, the provisional wiring zone production unit 811 makes out new provisional zone data signals of the first layer with reference to the new unit zone data signals for the first layer.

Figure 25:
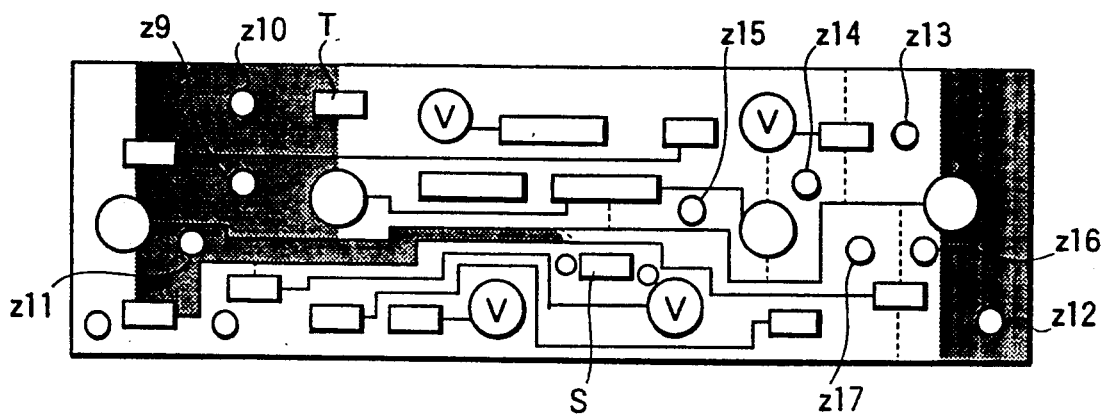
FIG. 25 shows a plan view of the specific wiring pattern for use in describing operation of the provisional path searching unit illustrated in FIG. 16.

Turning to FIG. 25, ninth through twelfth new unit zones (specified by z9 to z12) are formed on the first layer with reference to the new provisional unit zone data signals of the second layer and are represented by new unit zone data signals for the first layer. In FIG. 25, the new unit zones are extended to the end point T. Thus, the provisional wiring zone data signals are successively produced until the new unit zones reach the end point T.

Figure 26:
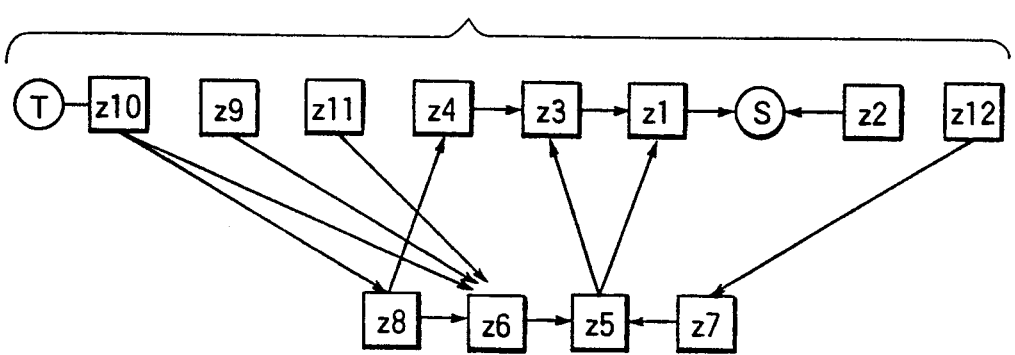
FIG. 26 shows a data structure derived from the specific wiring pattern illustrated in FIG. 26.

Referring to FIG. 26, interconnection paths between the start point S and the end point T are obtained by the above-mentioned operation carried out about the first and the second layers illustrated in FIGS. 17, 18, and 25. The unit zones z1 through z12 are concatenated to form the interconnection paths between the start and the end points S and T and are represented by the unit zone data signals for the first through the twelfth unit zones z1 to z12. This shows that the interconnection paths illustrated in FIG. 26 may be replaced by a concatenation or a network of the unit zone data signals which have pointers. Taking this into consideration, the pointers are symbolized by arrows in FIG. 26. The concatenation of the unit zone data signals may be called a wiring candidate data signal.

(b) Path decision unit 82

The path decision unit 82 of the path searching 511 illustrated in FIG. 16 is operable to form new via hole or holes and new connection conductors on the basis of the wiring candidate data signal obtained by the provisional path searching unit 81 and to produce new wiring position data signals indicative of the new holes and the new connection conductors and new wiring unit data signals in a manner to be described in detail.

Figure 27:
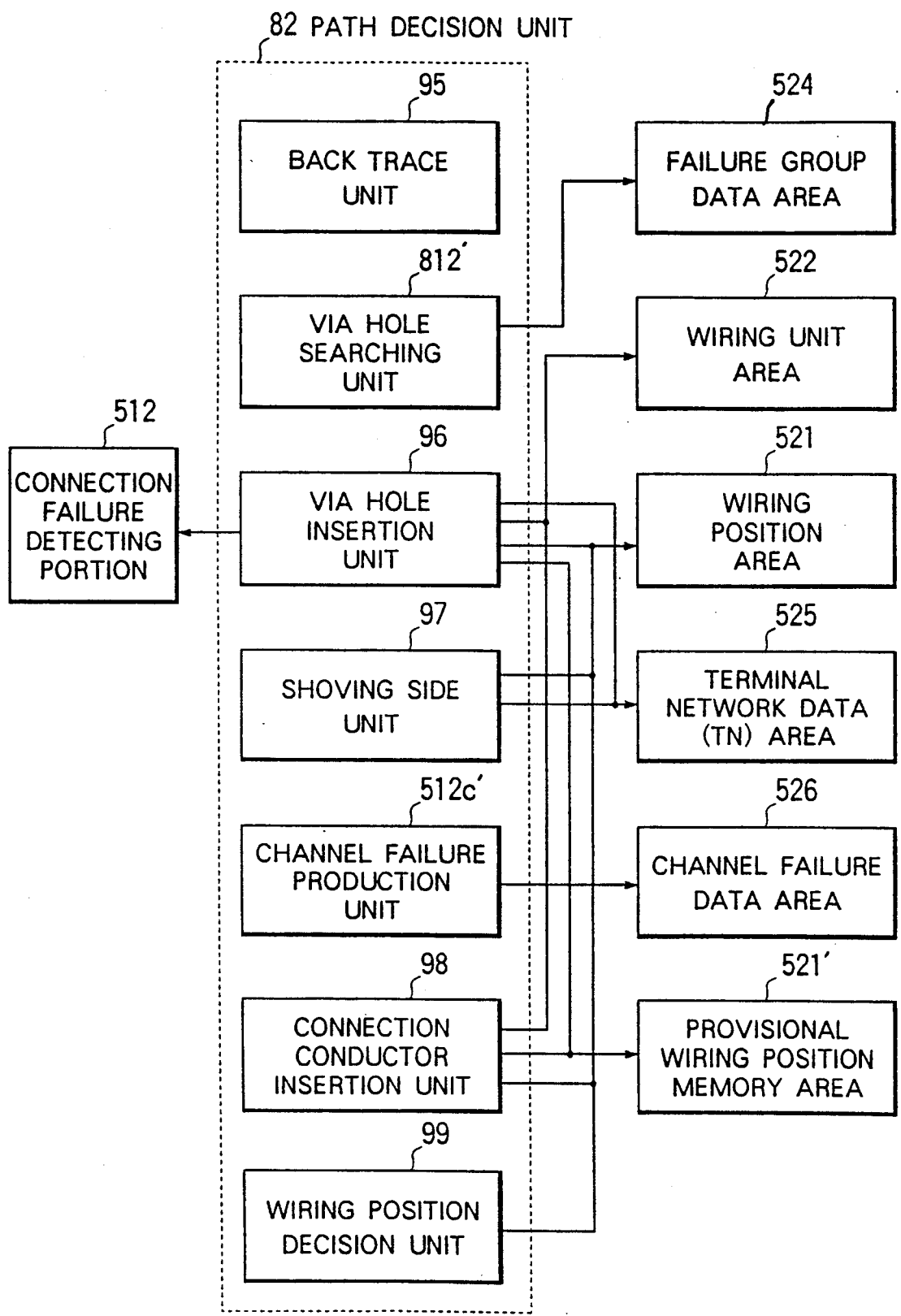
FIG. 27 shows a block diagram of a path decision unit illustrated in FIG. 16.

Referring to FIG. 27, the path decision unit 82 according to the first embodiment of this invention comprises a back trace unit 95, a via hole insertion unit 96, a shoving aside unit 97, 98, a connection conductor insertion unit 98, and a wiring position decision unit 99 together with a via hole searching unit and a channel failure production unit which may be identical with those illustrated in FIGS. 10 and 19, respectively, and which will be designated by 812′ and 512c′, respectively.

(1) Back trace unit 86

Referring to FIGS. 17 through 19, description will be made about operation of the back trace unit 86 illustrated in FIG. 27. The back trace unit 86 successively selects the unit zone data signals of the wiring candidate signal from the end point T to the start point S. Such a back trace operation is practically carried out by tracing the pointers attached to the unit zone data signals. In addition, the back trace unit 86 accesses the failure memory 524 to detect whether or not a partial combination of the unit zone data signals connected to one another through the via hole or holes is coincident with the failure unit data signals memorized in the failure memory 524. On detection of coincidence between the partial combination and one of the failure unit data signals, the back trace unit 86 again selects another combination of the unit zone data signals of unit zones connected through the via holes to one another. At any rate, the combinations of the unit zone data signals are successively produced by the back trace unit 95.

Thereafter, the via hole searching unit 812' and the via hole insertion unit 96 are alternatingly operated to determine whether or not a via hole can be inserted among the unit zones in a manner mentioned in conjunction with FIG. 19. This operation is carried out to search for the via hole formable area, as mentioned in conjunction with FIG. 24. When it is possible to insert the via hole, the via hole insertion unit 96 is driven to insert the via hole among the unit zones.

(2) Via hole insertion unit 96

As illustrated in FIG. 27, the via hole insertion unit 96 is operable in cooperation with the shoving aside unit 97 and the connection failure detecting portion 512 illustrated in FIG. 10. The via hole insertion unit 96 detects the via hole formable area to produce a wiring position data signal representative of a position of the via hole formable area. In addition, the via hole insertion unit 96 also produces a wiring unit data signal which includes a pointer pointing out the wiring position data signal mentioned above. The wiring position data signal and the wiring unit data signal are memorized into the wiring position area 521 and the wiring unit area 522, respectively.

Subsequently, the via hole insertion unit 96 is moved in a manner to be described hereinunder.

Figure 28:
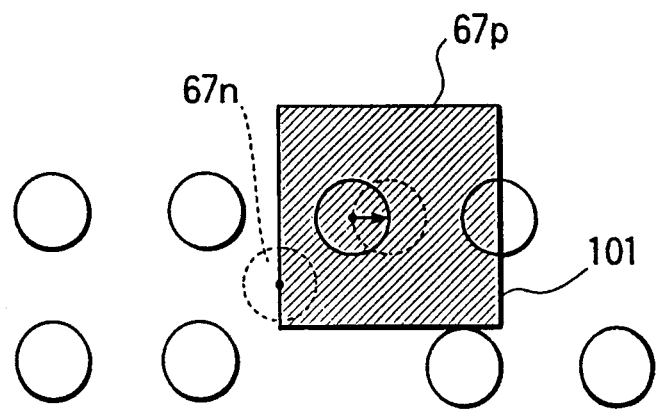
FIG. 28 shows an arrangement of via holes for use in describing operation of the path decision unit illustrated in FIG. 27.

Referring to FIG. 28, it is assumed that via holes are previously arranged on a print circuit board, as depicted at solid lines, and may be called previous via holes. In FIG. 28, one of the previous via holes is depicted at 67p. Under the circumstances, a new via hole 67n is located in the vicinity of the one previous via hole 67p without any acceptable interval, as shown by a broken line and the one previous via hole 67p is moved to a position shown by a broken line (67p') within a limit predetermined for the one previous via hole 67p in the provisional wiring position memory area 521'.

Thereafter, the via hole insertion unit 96 carries out calculation in accordance with Equation 3 to obtain a rectangle depicted at 101. The sizes or diameters of the one previous and the new via holes may be represented by Sz and Vd in Equation 3, respectively. The one previous via hole 67p and the rectangle 101 are moved to a renewed position at which a center of the new via hole 67n is located outside of the rectangle. The wiring position data signal for the one previous via hole 67p is renewed to indicate the renewed position. The via hole insertion unit 96 drives the terminal network production unit 512a of the connection failure detecting portion 512 illustrated in FIG. 10 to form terminal network data signals representative of relationships between the new via hole 67n and the adjacent via holes. The terminal network data signals are memorized into the connection failure area 523.

Next, the via hole insertion unit 96 puts the shoving aside unit 97 into operation each time when the previous via holes adjacent to the new via hole 67n are indicated.

(3) Shoving aside unit 97

Figure 29:
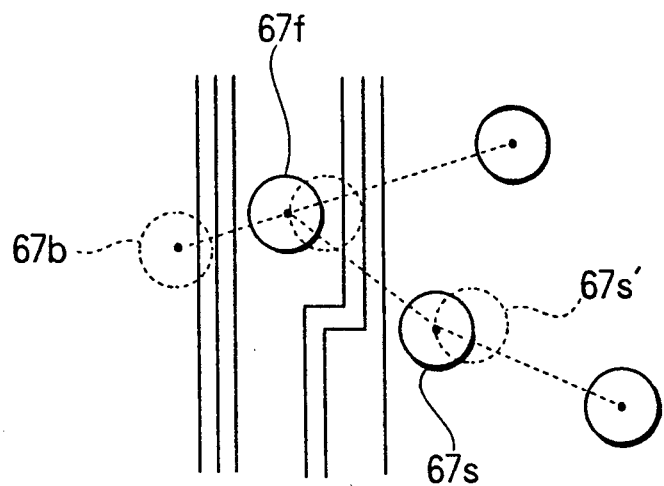
FIG. 29 shows a wiring pattern for use in describing another operation of the path decision unit.

Referring to FIG. 29, description will be made about operation of the shoving aside unit 97. In FIG. 29, first and second via holes 67f and 67s are located on a print circuit board with a set of connection conductors laid therebetween. The second via hole 67s is assumed to be positioned in the offset direction without any acceptable gap determined by Equation 3. In this event, terminal network data signals are derived from the first and the second via holes 67f and 67s. At first, the second via hole 67s is moved in the offset direction to a new position at which the acceptable gap is accomplished between the first and the second via holes, as depicted at 67s'. The shoving aside unit 97 renews the wiring position data signal to a renewed wiring position data signal which is representative of the new position of the second via hole. Thereafter, the first via hole 67f is also pushed in the offset direction to another renewed position, as depicted at a broken line. Subsequently, the shoving aside unit 97 drives the terminal network production unit 512a (FIG. 10). The terminal network production unit 512a adds or renews the terminal network data signal of the via hole located at the renewed position and terminal network data signals of the other via holes. Such terminal network data signals are memorized into the connection failure memory 523.

Thus, after completion of operation of the shoving aside unit 97, the operation is followed by the via hole insertion unit 96. The via hole insertion unit 96 inserts a new via hole 67b, as shown in FIG. 29, with adjacent via holes shoved aside around the new via hole 67b and accesses the offset movement unit 512b (FIG. 10). Consequently, all of the adjacent via holes shoved aside are moved in the offset direction to offset positions. The offset direction may be carried out in four directions, namely, front side, rear side, lefthand side, and righthand side directions. The offset movement unit 512b derives provisional wiring position data signals at the offset positions to supply the provisional wiring position memory area 521' with the provisional wiring position data signals. At any event, the wiring position data signals are renewed into the provisional wiring position data signals. As a result, the provisional wiring position memory area 521' memorizes four kinds of the provisional wiring position data signals which are obtained by moving the via holes in the four offset directions.

Herein, it is surmised that the via hole searching unit 812' detects that no via hole can be inserted in connection with a certain combination of unit zone data signals. In this case, the back trace unit 95 is operated in the path decision unit 82 to redo the back trace operation from a newest one of the via holes.

On the other hand, let no path be found out between the start and the end points S and T by the back trace unit 95. In this event, the wiring position area 521, the provisional wiring position memory area 521', the connection failure memory 523, and the wiring unit area 522 are returned back to states before insertion of any via holes. Thereafter, the back trace unit 95 is driven again to search for another path.

Now, description will be made about operation which is carried out in the path decision unit 82 after all of new via holes are successively inserted in connection with combinations of unit zone data signals selected by the back trace unit 82. At first, the channel failure production unit 512c' is put into operation to detect whether or not channel failure takes place at every one of the new via holes in the manner illustrated in conjunction with FIG. 7 and to supply the channel failure data area depicted at 526 (FIG. 27) with channel failure data signals.

After storage of the channel failure data signals into the channel failure data area 526, the provisional wiring production unit 811 is driven in the provisional path searching unit 81 to form provisional wiring zone data signals between via holes connected by previous unit area data signals and to search for paths between the via holes. When such paths exist between the via holes, the connection conductor insertion unit 98 is put into operation at every one of the paths.

Figure 30:
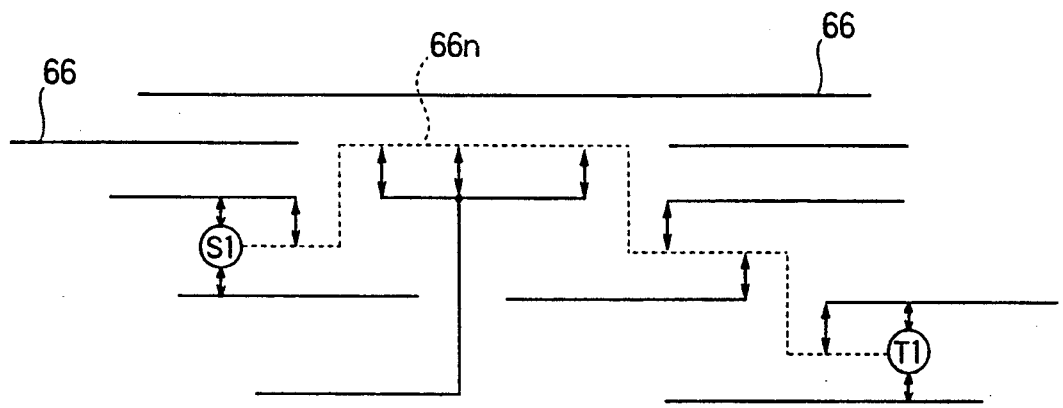
FIG. 30 shows a wiring pattern for use in describing a new connection conductor inserted in the specific wiring pattern.
Figure 31:
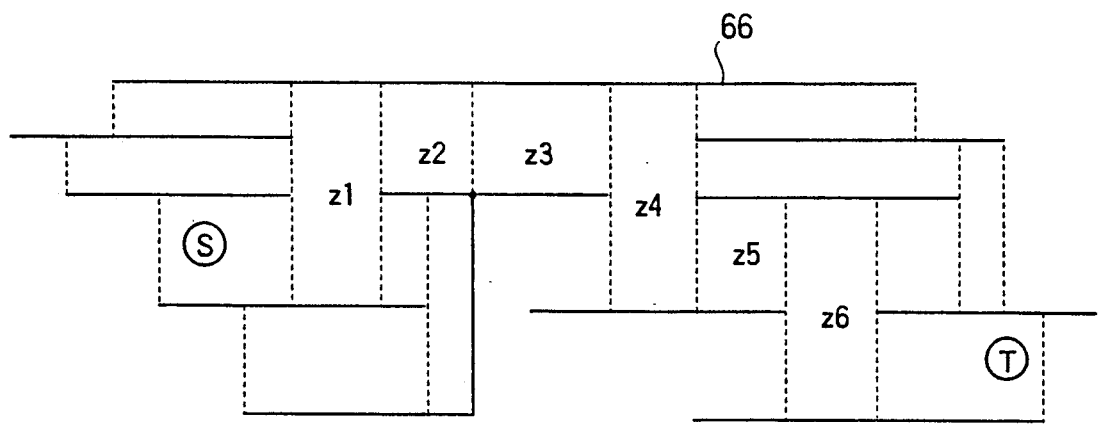
FIG. 31 shows a relationship among unit zones of the wiring pattern illustrated in FIG. 30.

Referring to FIGS. 30 and 31, the connection conductor insertion unit 98 processes a new connection conductor 66n which is shown by a broken line in FIG. 30 and which is inserted between previous connection conductors 66 shown by solid lines. The previous connection conductors 66 are represented by wiring unit data signals. The new connection conductor 66n is connected to both the start and the end points S and T. In this event, an area between the start and the end points S and T is divided into first through sixth unit zones z1 to z6 which are represented by first through sixth unit zone data signals, respectively.

Figure 32:
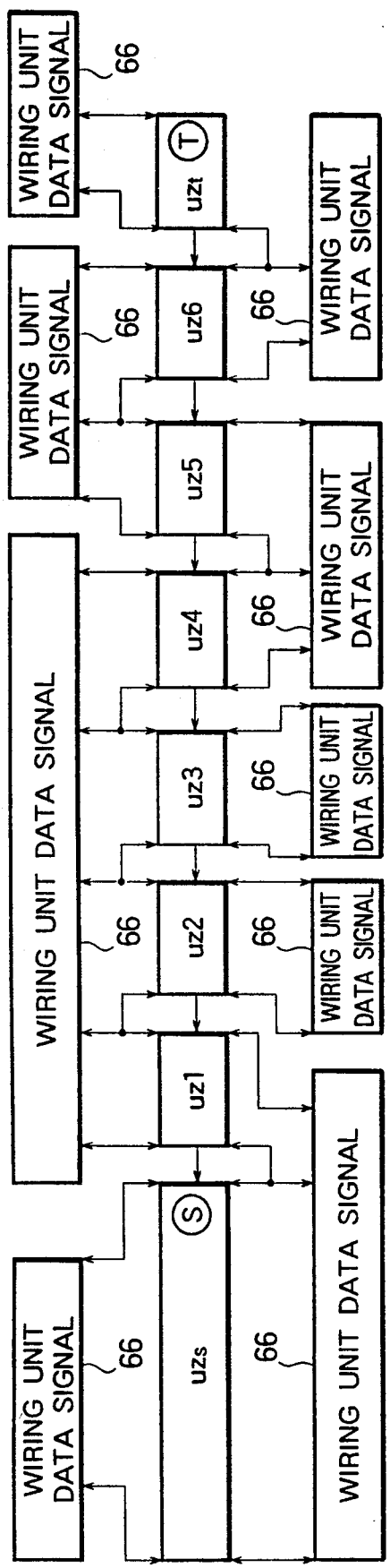
FIG. 32 shows a relationship among data signals derived from the wiring pattern illustrated in FIG. 30.

Referring to FIG. 32, the first through the sixth unit zone data signals depicted at uz1 to uz6 are illustrated together with start and end unit zone data signals uzs and uzt at the start and the end points S and T. The first through the sixth unit zone data signals uz1 to uz6 and the start and the end unit zone data signals uzs and uzt are made to correspond to the first through the sixth unit zones z1 to z6 and the start and the end points S and T illustrated in FIG. 31. With this data structure, the end unit zone data signals uzt points out the sixth unit zone data signal uz6. Likewise, the sixth through the first unit zone data signals uz6 to uz1 point out the fifth through the start unit zone data signals uz5 to uzs, respectively.

In addition, each of the first through the sixth unit zone data signals uz1 to uz6 and the start and the end unit zone data signals uzs to uzt has pointers indicating the wiring unit data signals 66 representative of the connection conductors adjacent to each unit zone, as indicated by double headed arrows.

Figure 33:
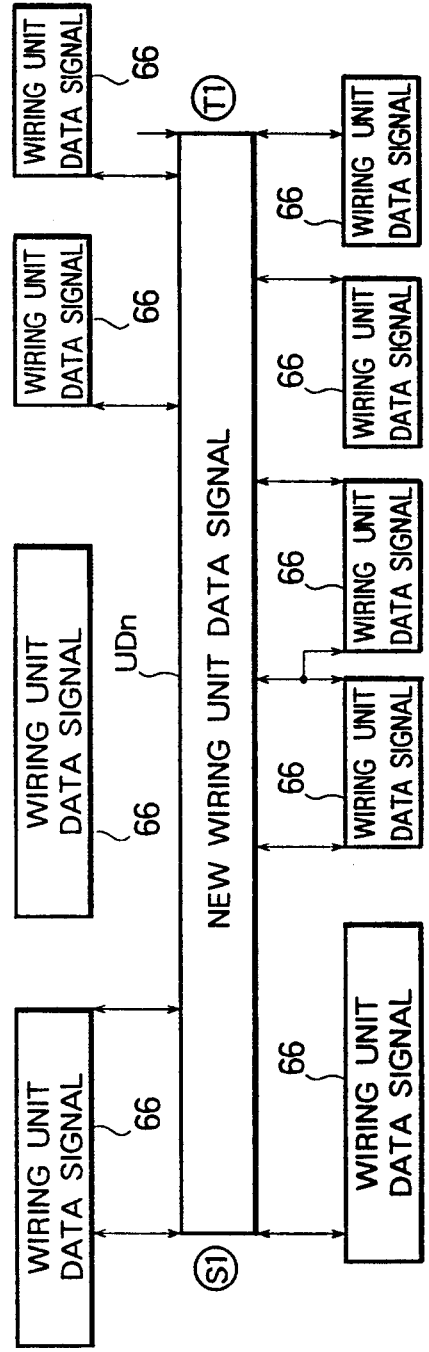
FIG. 33 shows a new data structure formed by the data signals illustrated in FIG. 32.

Referring to FIG. 33, the first through the sixth unit zone data signals uz1 to uz6 are combined together into a new wiring unit data signal UDn which is representative of the new connection conductor 66n (FIG. 30) and which includes pointers, as shown by arrows in FIG. 33. The new wiring unit data signal UDn is memorized into the wiring unit area 522.

It is to be noted that when the new connection conductor 66n represented by the wiring unit data signal UDn is inserted within an original pattern, as illustrated in FIGS. 30 through 34, elements, such as via holes, terminals, connection conductors, adjacent to the new connection conductor 66n might be moved so as to keep a predetermined gap between the new connection conductor 66n and the adjacent elements. To this end, the connection conductor insertion unit 98 is driven to keep a spacing between the new connection conductor 66n and the adjacent elements.

Figure 34:
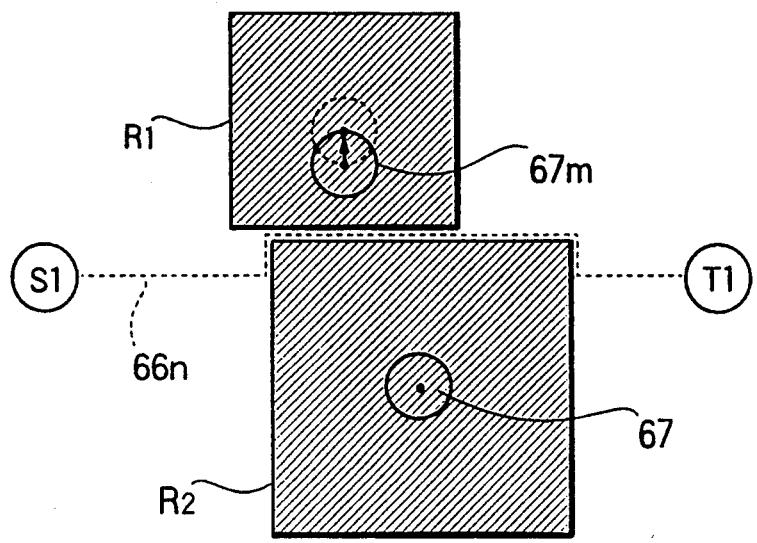
FIG. 34 shows a plan view for use in describing operation which is carried out to insert a new connection conductor.

Referring to FIG. 34, the connection conductor insertion unit 98 calculates a bundle width Bw which is allowable between the new connection conductor 66n and each element. Such calculation is carried out at every one of the elements. Thereafter, a rectangle is formed around every element by the connection conductor insertion unit 98 and is specified by a side represented by Sd. In FIG. 34, rectangles R1 and R2 are formed around via holes 67 and 67m between which the new connection conductor 66n is laid. When each size or diameter of the via holes 67 and 67m are collectively represented by Sv, the side Sd is given by:

$$Sd = Sv + Bw \times 2 + Wc, \qquad (4)$$

where Wc is representative of a width of the new connection conductor 66n.

Let consideration be made about the case where the rectangles on both sides of the new connection conductor 66n are superposed on each other. In this case, either one of the via holes 67 and 67m that is the via hole 67m in FIG. 34 is moved so that such superposition is removed between the rectangles, as illustrated in FIG. 34. For this purpose, the wiring position data signals are read out of the provisional wiring position memory area 521' and the via hole 67m is moved to a new position within a limit determined by the wiring position data signals. A new wiring data signal is derived from the new position and is memorized into the wiring position area 521 to be substituted for a previous wiring data signal at the new position. Thus, the wiring data signal is successively renewed.

Moreover, the connection conductor insertion unit 98 puts the shoving aside unit 97 into operation to shove aside the via holes each time when the via holes are given which are renewed. Subsequently, the offset movement unit 512b is driven so as to move all of the via holes shoved aside in four offset directions and to determine provisional wiring position data signals. The provisional wiring position data signals are memorized into the provisional wiring position memory area 521' and substituted for previous wiring position data signals. Thus, the wiring position data signals are successively renewed in the provisional wiring position memory area 521'. Thereafter, operation is followed by the wiring position decision unit 99 illustrated in FIG. 27.

Now, description will be made about operation which is carried out in the path decision unit 82 when the new connection conductor 66n is not successfully inserted among existing connection conductors in FIGS. 30 and 31. In this event, the channel failure production unit 512c' is put into operation so as to process the via holes placed on both sides of the new connection conductor 66n. Specifically, the channel failure production unit 512c' produces channel failure data signals in connection with the above-mentioned via holes to memorize them into the connection failure area 523. Thereafter, the provisional wiring zone production unit 811 is operated by the path decision unit 82 to search for the remaining unconnected paths between the via holes.

Thus, operation is repeated to form and determine paths between via holes by the use of the provisional wiring zone production unit 811, the connection conductor insertion unit 98, and the channel failure production unit 512c'.

Interruption of path searching operation:

In the path decision unit 82, let channel failure data signals be produced by the path decision unit 82. As a result, the remaining paths can not be searched by the path decision unit 82. In this case, the path searching portion is put into an inactive state in connection with current pin pair data signals. A result of processing the current pin pair data signals is erased. Instead, the path searching portion 511 is operated in connection with following pin pair data signals.

(4) Wiring position decision unit 99:

In the path decision unit 82, the wiring position decision unit 99 is operated after the new connection conductor 66n is inserted. The wiring position decision unit 99 carries out operation in response to the new wiring unit data signals in connection with the new connection conductor 66n and the wiring position data signals related to the via holes moved from previous positions.

More specifically, it is assumed that a specific one of the via holes moved from a previous position to a new position is adjacent to a connection conductor which is kept unmoved and which is located at a previous conductor position. Under the circumstances, the wiring position decision unit 99 judges whether or not an acceptable gap is left between the new position of the specific via hole and the previous conductor position. Such judgement is practically carried out by the use of the wiring position data signals.

If the acceptable gap is not left between them, another via hole or terminal is searched by reading a terminal network data signal intersecting the connection conductor with reference to the terminal network, connected to the specific via hole. An intermediate connection conductor between the via holes mentioned above is detected by the wiring position decision unit 99 to derive a wiring unit data signal from the intermediate connection conductor. The wiring unit data signal for the intermediate connection conductor is registered into the wiring unit area 522 as an unprocessed wiring unit data signal.

Similar operation is also carried out about the new connection conductor which is inserted in the above-mentioned manner and which is represented by a new wiring unit data signal. Specifically, let the new connection conductor be interposed between adjacent connection conductors which is located at previous conductor positions specified by previous wiring position data signals. The wiring position decision unit 99 also carries out operation so as to judge by the use of the previous wiring position data signals whether or not a spacing sufficient for inserting the new connection conductor is left between the adjacent connection conductors. If no sufficient spacing is left between the adjacent connection conductors, the wiring position decision unit 99 detects connection conductors which are located between the new connection conductors and the other elements, such as via holes, terminals, with reference to wiring unit data signals for the above-mentioned detected connection conductors. The wiring unit data signals are registered into the wiring unit area 522 as unprocessed wiring unit data signals.

Herein, the unprocessed wiring unit data signals may be considered as representing unprocessed elements which are adjacent to other elements that may be called existing elements. In this case, a bundle width of connection conductors is calculated by the wiring position decision unit 99 between each of the unprocessed elements and the existing elements. Thereafter, rectangular regions are formed around the existing elements in accordance with Equation 4. Such calculation of the bundle width is carried out by the use of the wiring unit data signals for the unprocessed elements and the wiring position data signals for the existing elements.

Figure 35:
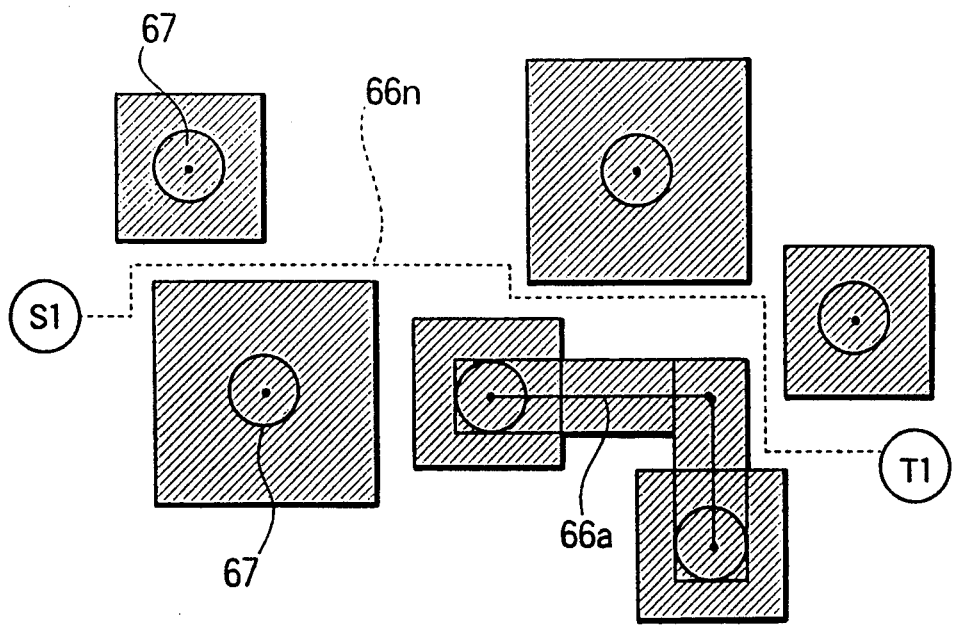
FIG. 35 shows a plan view for use in describing another operation for forming a connection conductor.

Referring to FIG. 35, a new connection conductor 66n is wired in a zone which is different from the zones surrounding an existing connection conductor 66a and a via hole 67. A wiring position data signal of the new connection conductor 66n is formed to be recorded into the wiring position area 521. Wiring data signals are wiring unit data signals are also formed which include the pointer indicating the additional wiring position data signals.

Figure 36:
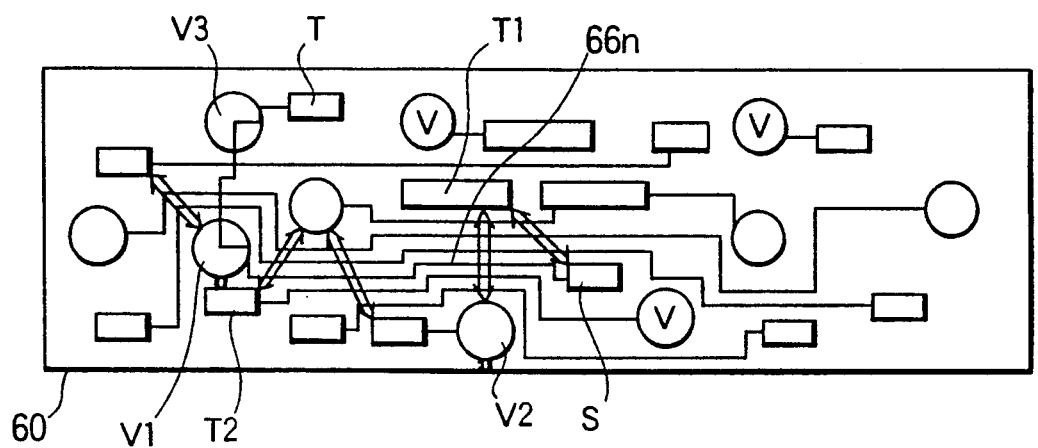
FIG. 36 shows a plan view for use in describing a new wiring pattern formed by this invention.

Referring to FIG. 36, the above-mentioned operation is used for wiring a new connection path between the start and the end points S and T on the print circuit board 60 illustrated in FIG. 17. For this purpose, a new connection conductor 66n is connected between the start end S and a first via hole V1. The new connection conductor 66n is inserted among the other connection conductors between a second via hole V2 and a first terminal T1 by moving a second via hole V2 downwards of FIG. 36, as symbolized by an arrow. In addition, a third via hole V3 is formed on the print circuit board 60 as a new via hole and is electrically connected to the first via hole V1 through a connection conductor laid on a second layer. The third via hole V3 is connected to the end point T. Thus, the new connection path is formed between the start and the end points S and T. In FIG. 36, it is to be noted that channel failure data signals are given between the first terminal T1 and the start point S, between the first terminal T1 and the second via hole V2, between the second terminal and the first via hole V1, and so forth, as shown by arrows.

At any rate, when wiring operation is completed as regards all of the unprocessed wiring unit data signals, the wiring position decision unit 99 is put into an inactive state together with the path searching portion 511. Subsequently, a following pin pair data signal is read out of the connection point input portion 514 (FIG. 2) and is processed one by one by the path searching portion 511 and the connection failure detecting portion 512 in the above-mentioned manner.

Second Embodiment

An automatic router according to a second embodiment of this invention is for use for visually displaying connection failure positions which are specified by channel failure data signals along with unit zones having no via hole formable area. The connection failure positions are superposed on wiring positions represented by wiring position data signals on a display device (not shown). With this structure, an operator can readily detect the connection failure positions, which facilitates wiring operation.

Third Embodiment

An automatic router according to a third embodiment of this invention forms no terminal network data signals and instead renews a provisional wiring position memory area 521' (FIG. 12). In this event, the offset movement unit 512b (FIG. 10) of the connection failure detecting portion 512 carries out offset movement operation only when the wiring position data signals are read out of the provisional wiring position memory area 521' in order to determine a provisional wiring path.

Offset movement unit 512b

Figure 37:
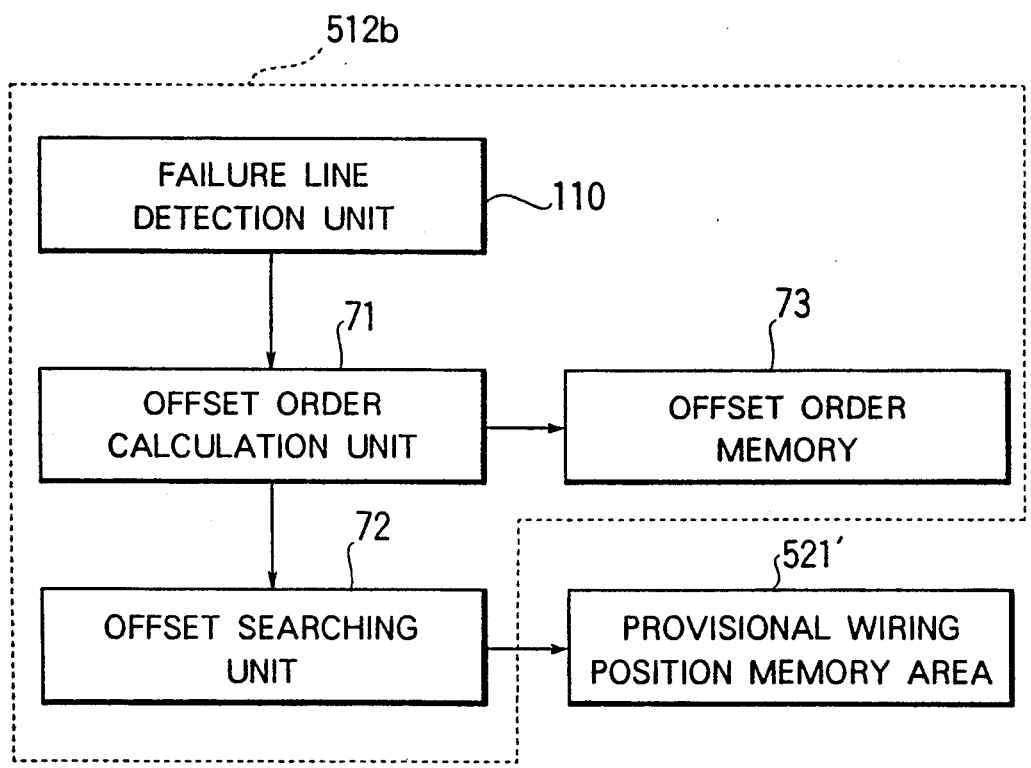
FIG. 37 shows a block diagram of an offset movement unit according to a second embodiment of this invention.

Referring to FIG. 37, the offset movement unit 512b comprises a failure line detection unit 110 in addition with the offset order calculation unit 71, the offset searching unit 72, and the offset order memory 73 which are illustrated in FIG. 12.

(1) Failure line detection unit 110

The failure line detection unit 110 is operable in response to a selected wiring position data signal representative of a selected via hole. Thereafter, the failure line detection unit 110 read wiring position data signals representative of adjacent via holes and terminals adjacent to the selected via hole in the offset direction.

Under the circumstances, the following operation is carried out in the failure line detection unit 110. The selected via hole is connected to each of the adjacent via holes and the adjacent terminals through line segments. The failure line detection unit 110 calculates a width of a connection conductor intersecting each of the line segments and an acceptable minimum gap to sum up the width and the acceptable minimum gap and to obtain a bundle width Bw equal to a sum of the width and the acceptable minimum gap. A rectangle is calculated in connection with each of the adjacent via holes and the adjacent terminals in accordance with Equation 1.

Herein, it is surmised that the selected via hole and the other elements are located on an orthogonal coordinate having orthogonal axes. This shows that each element, such as via holes, terminals, can be projected onto both axes together with the rectangles. Let the selected via hole be projected or mapped to form a mapped via hole region onto the axis orthogonal to the offset direction. The failure line detection unit 110 at first judges whether or not the mapped via hole region is superposed on a mapped rectangular region obtained by mapping each rectangle onto the above-mentioned axis. If the mapped via hole region is superposed on the mapped rectangular region, the failure line detection unit 110 forms a failure line data signal.

Thereafter, the selected via hole is mapped together with the adjacent via holes and the adjacent terminals onto the other axis parallel to the offset direction to form first and second additional mapped regions for the selected via holes and the adjacent elements, respectively. The failure line detection unit 110 further judges whether or not a distance between the first and the second additional mapped regions is smaller than a width which an object or an element to be inserted has and which is equal to a sum of the size of a via hole or a terminal and an acceptable minimum gap.

If the distance between the first and the second additional mapped regions is smaller than the sum, the failure line detection unit 110 forms the failure line data signal.

In this case, the failure line data signal is representative of the line segment between the selected via hole and each adjacent element and includes a pointer which indicates a wiring unit data signal indicative of both ends and an intermediate element between both of the ends. The following failure line data signals are successively formed from one of the ends in a manner similar to the terminal network data signals illustrated in FIG. 11. A concatenation of the failure line data signal is stopped at an edge of the print circuit board or at each terminal.

(2) Offset order calculation unit 71

The offset order calculation unit 71 determines the offset order with reference to the failure line data signals obtained by the failure line detection unit 110 in the manner mentioned in conjunction with FIG. 12, instead of the terminal network data signals used in the first embodiment of this invention.

(3) Offset searching unit 72

The offset searching unit 72 is similar in structure and operation to that illustrated in FIG. 12 except that the failure line data signals are used instead of the terminal network data signals.

(4) Channel failure production unit 512c

The channel failure production unit 512c is operable in cooperation with the offset unit 512b according to the third embodiment of this invention to obtain a wiring data signal indicative of a position to which a via hole is movable. To this end, the channel failure production unit 512b is given an offset direction, a width of a connection conductor to be inserted, and an acceptable minimum gap. In addition, the channel failure data signals are successively produced by the channel failure production unit 512c by the use of wiring position data signals memorized in the provisional wiring position memory area 512'.

(5) Via hole searching unit 812

The via hole searching unit 812 is similar to that illustrated in FIG. 19 except that the via hole searching unit 812 cooperates with the offset movement unit 512b illustrated in FIG. 37 to form a wiring position data signal indicative of a range within which a via hole is movable. The via hole searching unit 812 is given the offset direction, a diameter of a via hole to be inserted, and an acceptable minimum gap.

(6) Via hole insertion unit 96

The via hole insertion unit 96 determines a movable range of a via hole, like the via hole searching unit 812 to attain a wiring position data signal indicative of the movable range. The shoving aside unit 97 is operable in response to the failure line data signals produced by the offset movement unit 512b illustrated in FIG. 37, in lieu of the terminal network data signals.

(7) Connection conductor insertion unit 98

The connection conductor insertion unit 98 is operable in cooperation with the offset movement unit 512b illustrated in FIG. 37 so as to move adjacent via holes after a new connection conductor is inserted and to form a wiring position data signal related to a new position. As a result, the connection conductor insertion unit 98 produces the failure line data signal instead of the terminal network data signal and puts the shoving aside unit 97 into operation in connection with the via hole in question.

The other operations and structure are similar to those illustrated in conjunction with the first embodiment of this invention and will therefore be omitted.

Fourth embodiment

An automatic router according to a fourth embodiment of this invention comprises a provisional path searching unit 81 which is included in a path searching unit 511, as illustrated in FIG. 16, and which can insert a via hole and a connection conductor, although such insertion is carried out in the path decision unit 82 in the automatic router according to the first through the third embodiments of this invention.

More specifically, the provisional path searching unit 81 comprises a provisional wiring zone production unit 811 and a via hole searching unit 812, like in FIG. 19. In addition, the automatic router according to the fourth embodiment comprises a path species failure memory in the provisional path memory illustrated in FIG. 19.

The provisional wiring zone production unit 811 is operated to form, on the first layer, provisional wiring zone data signals representative of provisional wiring zones in the first place, as illustrated by meshed portions in FIG. 17. Subsequently, the via hole searching unit 812 forms, on the second layer, new unit zone data signals indicative of new unit zones z5 to z8, as illustrated in FIG. 18. Supplied with the new unit zone data signals, the provisional wiring zone production unit 811 makes out provisional wiring zone data signals in the second place, as illustrated in FIG. 18.

Thus, all of the provisional wiring zone data signals in the second place are produced from the provisional wiring zone data signals in the first place. Subsequently, one of the provisional wiring zone data signals in the second place is selected as a selected provisional wiring zone data signal indicative of a selected provisional wiring zone. A provisional via hole is provided between the selected provisional wiring zone and one of the provisional wiring zones in the first place by the use of the via hole insertion unit 96.

Figure 38:
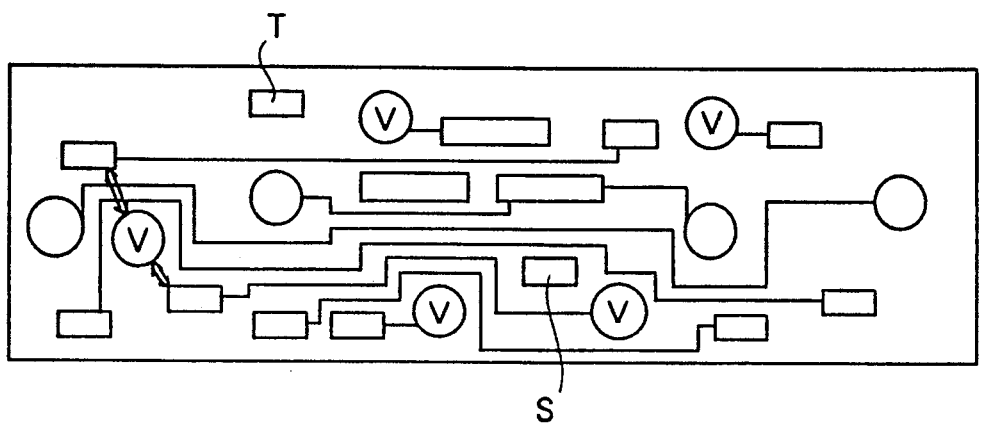
FIG. 38 shows a plan view for use in describing a wiring pattern formed by the use of another embodiment of this invention.

Referring to FIG. 38, the channel failure production unit 512' produces channel failure data signals as symbolized by arrows in connection with the provisional via hole depicted at V. The channel failure data signals are combined with the wiring position data signal of the via hole V and memorized into the path species failure memory.

Figure 39:
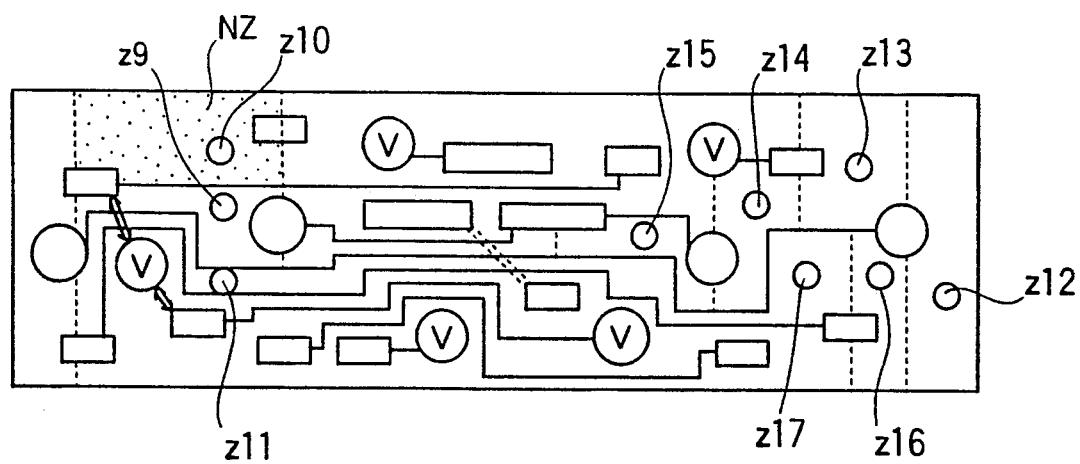
FIG. 39 shows another plan view for use in describing another wiring pattern formed by the use of another embodiment of this invention.

Next, the via hole searching unit 812 makes out a new unit zone data signal representative of a new unit zone depicted at NZ in FIG. 39 on the first layer (or a third layer) with reference to the provisional wiring zone data signals in the second place. Thereafter, the provisional wiring zone production unit 811 forms provisional wiring zone data signals representative of provisional wiring zones in the third place. In FIG. 39. the provisional wiring zones in the third place reach the end point T.

On the other hand, when the via hole searching unit 812 judges that a via hole can not be inserted within a unit zone which is specified by a unit zone data signal included in the provisional wiring zone in the second place and which may be called an impossible unit zone, the via hole searching unit 812 collects a combination of two unit zones already connected to each other through a new via hole inserted, along with the impossible unit zone. Such collection of the unit zones is practically carried out by collecting unit zone data signals of the above-mentioned unit zones into a failure group signal. The failure group signal is memorized into the failure memory 524.

Herein, it is assumed that the provisional wiring zones in the third place do not reach the end point T. In this event, the provisional via hole is removed which connects the provisional wiring zones in the first place to the provisional wiring zones in the second place. Subsequently, another one of the provisional wiring zones in the second place is selected to tentatively form another via hole intervening between the selected provisional wiring zone in the second place and the provisional wiring zone in the first place. Such operation is executed by the use of the provisional wiring zone data signals. Thereafter, the provisional wiring zone data signals in the third place are formed.

Thus, all possible provisional wiring zone data signals in the third place are formed from the provisional wiring zone data signals in the second place. In this situation, one of the provisional wiring zone data signals in the third place is selected so that the via hole searching unit 812 searches for a first via hole connecting the area for the third place to the second place and a second via hole connecting the second via hole to the first places. The via hole searching unit 812 provides other unit areas on a different layer surface with reference to the provisional wiring zone of the third place while the provisional wiring zone forming unit 811 produces a provisional wiring zone data signal of the third place on the unit zone. Subsequently, provisional wiring zone data signals in the fourth place are formed by the via hole searching unit 812. Such operation is continued until provisional wiring zones reach the end point T. After such searching operation, wiring candidate data signals are produced by the via hole searching unit 812.

When the wiring candidate data signals are produced by the provisional path searching unit 81, the path decision unit 82 (FIG. 16) is driven to obtain a new wiring unit data signal indicative of a new wiring unit. The new wiring unit data signals are produced by the use of the back trace unit 95 and the connection conductor insertion unit 98 (FIG. 27). Subsequently, a channel failure data signal is derived by the channel failure production unit 512c' from an area adjacent to the new wiring unit. When the start and the end points S and T are connected to each other, the wiring position decision unit 99 decides a new connection conductor to make out a wiring position data signal indicative of the new connection conductor.

Fifth embodiment

An automatic router according to a fifth embodiment of this invention comprises a wiring optimizing unit for removing an existing wiring represented by the failure group data signals and rearranging a wiring. More particularly, the wiring optimizing unit reads the failure group data signals out of the memory circuit 52 to remove wiring unit data signals related to the failure group data signals together with channel failure data signals and failure group data signals concerned with the above-mentioned failure group data signals. A new wiring is formed by the use of the path searching unit 511 and the connection failure detecting unit 512, instead of a removed wiring represented by the removed wiring unit data signals. In this event, new channel failure data signals and new failure group data signals are produced and new wiring positions are fixed when new failures are smaller than previous failures appearing before removal of via holes.

As mentioned before, this invention at first produces wiring connectable candidate data signals by the provisional path searching unit 81 of the path searching unit 511 and thereafter moves a connection conductor and a via hole by the path decision unit 82 to insert a new connection conductor. Therefore, it is possible to search for a new path within a short time in a manner similar to the shoving aside method without trial-and-error. In addition, connection failures are evaluated by the channel failure data signals and the failure group data signals related to the via hole. In order to remove such failures, the rip-up method is manually used. This shows that optimization of wiring positions is possible for a short time.

Thus, this invention detects failures prior to insertion of a new connection conductor. Therefore, the automatic router according to this invention carries out for a short time in comparison with the conventional rip-up method.

Figure 40:
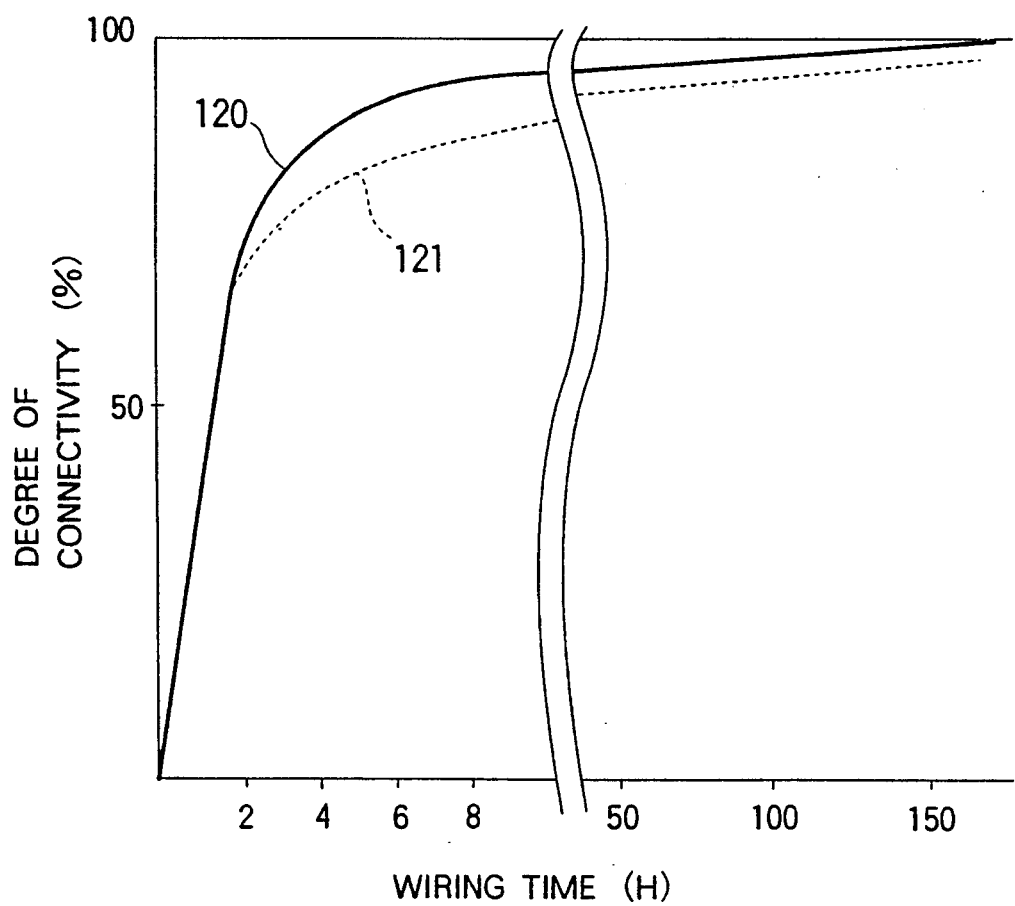
FIG. 40 shows a graphical representation of characteristics of the automatic router according to this invention and a conventional router so as to compare the characteristics with each other.

Referring to FIG. 40, a curve 120 shows a relationship between a wiring time and a degree of connectivity taken along an abscissa and an ordinate, respectively, when the automatic router according to this invention is used while a curve 121 shows similar relationship of the conventional rip-up method. As is apparent from the curves 120 and 121, the automatic router according to this invention can establish a high degree of connectivity for a short time in comparison with the conventional rip-up method.

What is claimed is:

1. An automatic router comprising:
    means for designating a pair of terminals to be connected to each other;

means responsive to said designating means for memorizing a line segment data signal representative of a line segment connected to both of the terminals;

means responsive to the memorizing means for calculating a bundle width of a connection conductor intersecting said line segment;

means for further calculating an acceptable minimum length of said line segment that is equal to said bundle width in order to obtain a modification with said acceptable minimum length kept unchanged and to judge whether or not said line segment can be expanded to the extent that a conductor connection can be inserted by said modification;

means responsive to said calculating means for memorizing a connection failure when said line segment can not be expanded to the extent that said conductor connection can be inserted;

means responsive to said connection failure for searching for candidate paths between said terminal pair on the condition that said candidate paths neither intersect a provisional path nor intersect the line segment which accompanies the connection failure; and means responsive to said search for determining a wiring location data signal from said candidate paths by determining the location of said candidate path.

2. A router as claimed in claim 1, further comprising:
means responsive to said connection failure for displaying the connection failure in superposition on wiring locations in order to remove the connection failure.

3. A router as claimed in claim 1, further comprising:
optimizing means for optimizing a wiring pattern from said wiring location data signal by removing the candidate paths which might bring about the connection failure.

4. An automatic router as claimed in claim 1, wherein said connection elements comprise via holes and terminals, wherein said connection failure detecting means comprises:

channel failure detecting means for detecting, as said connection failures, channel failures between two adjacent ones of said connection elements to produce channel failure data signals representative of said channel failures;

offset movement means for moving either ones of the two adjacent connection elements in a predetermined direction to a new position to make said channel failure detecting means detect whether or not the channel failures remain at said new position with an interval left from the other conductor elements.

5. An automatic router as claimed in claim 4, wherein said offset movement means moves, as either one of the two adjacent connection elements, a single one of said via holes in the predetermined direction.

6. An automatic router as claimed in claim 4, said via holes and said terminals being located on a coordinate system and being represented by coordinate components, wherein said connection failure detection means further comprises:

means for detecting whether or not the coordinate components of each via hole is superposed on those of the other via holes to produce a terminal network data signal which is representative of the superposition of the coordinate components and which specify said connection failures.

* * * * *